United States Patent
Sasaki

(10) Patent No.: US 9,853,059 B2
(45) Date of Patent: *Dec. 26, 2017

(54) SEMICONDUCTOR DEVICE

(71) Applicant: Japan Display Inc., Tokyo (JP)

(72) Inventor: Toshinari Sasaki, Tokyo (JP)

(73) Assignee: Japan Display Inc., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/186,625

(22) Filed: Jun. 20, 2016

(65) Prior Publication Data

US 2017/0005200 A1 Jan. 5, 2017

(30) Foreign Application Priority Data

Jul. 2, 2015 (JP) ................................ 2015-133253

(51) Int. Cl.
*H01L 27/12* (2006.01)
*H01L 29/786* (2006.01)
(Continued)

(52) U.S. Cl.
CPC ...... *H01L 27/1222* (2013.01); *H01L 27/1225* (2013.01); *H01L 27/1237* (2013.01); *H01L 27/1251* (2013.01); *H01L 29/41733* (2013.01); *H01L 29/41741* (2013.01); *H01L 29/42384* (2013.01); *H01L 29/7869* (2013.01);
(Continued)

(58) Field of Classification Search
CPC ........... H01L 29/7869; H01L 29/78696; H01L 27/1225; H01L 29/42384; H01L 29/78645; H01L 29/66969; H01L 29/78693; H01L 29/78642; H01L 29/41733; H01L 29/41741; H01L 27/1222
See application file for complete search history.

(56) References Cited

U.S. PATENT DOCUMENTS 9,559,214 B2 * 1/2017 Sasaki ................ H01L 29/7869
9,564,538 B2 * 2/2017 Sasaki ................ H01L 29/7869
(Continued)

FOREIGN PATENT DOCUMENTS

JP 2010-062229 A 3/2010

OTHER PUBLICATIONS

Tomita et al., "Transistor sizing for AMLCD integrated TFT drive circuits", Journal of SID 5/4. 1997, pp. 399-404.*

*Primary Examiner* — Tom Thomas
*Assistant Examiner* — Vincent Wall
(74) *Attorney, Agent, or Firm* — Typha IP LLC

(57) ABSTRACT

A semiconductor device includes a first transistor including a first electrode, a first insulating layer above the first electrode, the first insulating layer having a first side wall, a first oxide semiconductor layer on the first side wall, the first oxide semiconductor layer being connected with the first electrode, a first gate electrode, a first gate insulating layer, and a second electrode above the first insulating layer, the second electrode being connected with the first oxide semiconductor layer; and a second transistor including a third electrode, a fourth electrode separated from the third electrode, a second oxide semiconductor layer between the third electrode and the fourth electrode, the second oxide semiconductor layer being connected with each of the third electrode and the fourth electrode, a second gate electrode, and a second gate insulating layer.

20 Claims, 32 Drawing Sheets

(51) Int. Cl.
*H01L 29/423* (2006.01)
*H01L 29/417* (2006.01)

(52) U.S. Cl.
CPC .. *H01L 29/78642* (2013.01); *H01L 29/78645* (2013.01); *H01L 29/78696* (2013.01)

(56) References Cited

U.S. PATENT DOCUMENTS

| | | | | |
|---|---|---|---|---|
| 9,679,922 | B2* | 6/2017 | Sasaki | H01L 27/124 |
| 2004/0232495 | A1* | 11/2004 | Saito | H01L 29/41733 |
| | | | | 257/382 |
| 2004/0245524 | A1* | 12/2004 | Hirakata | H01L 27/1214 |
| | | | | 257/59 |
| 2007/0187678 | A1* | 8/2007 | Hirao | H01L 21/02422 |
| | | | | 257/43 |
| 2009/0267067 | A1* | 10/2009 | Jinbo | H01J 37/32018 |
| | | | | 257/57 |
| 2011/0233555 | A1* | 9/2011 | Endo | H01L 29/41733 |
| | | | | 257/60 |
| 2011/0240998 | A1* | 10/2011 | Morosawa | H01L 29/41733 |
| | | | | 257/57 |
| 2011/0248270 | A1* | 10/2011 | Fukumoto | H01L 29/7869 |
| | | | | 257/59 |
| 2013/0001573 | A1* | 1/2013 | Lee | H01L 29/45 |
| | | | | 257/60 |
| 2013/0161732 | A1* | 6/2013 | Hwang | H01L 29/7827 |
| | | | | 257/329 |
| 2017/0104014 | A1* | 4/2017 | Sasaki | H01L 27/1225 |

* cited by examiner

SEMICONDUCTOR DEVICE

CROSS REFERENCE TO RELATED APPLICATIONS

This application is based upon and claims the benefit of priority from the prior Japanese Patent Application No. 2015-133253 filed on Jul. 2, 2015, the entire contents of which are incorporated herein by reference.

FIELD

The present invention relates to a semiconductor device, and an embodiment disclosed herein relates to a structure and a layout of a semiconductor device.

Recently, a driving circuit of a display device, a personal computer or the like includes a semiconductor device such as a transistor, a diode or the like as a microscopic switching element. Especially in a display device, a semiconductor device is used as a selective transistor that supplies a voltage or a current in accordance with the gray scale of each of pixels and also used in a driving circuit that selects a pixel to which the voltage or the current is to be supplied. The characteristics required of a semiconductor device vary in accordance with the use thereof. For example, a semiconductor device used as a selective transistor is required to have a low off-current or little variance from another selective semiconductor. A semiconductor device used in a driving circuit is required to have a high on-current.

To be used in a display device as described above, a semiconductor device including a channel formed of amorphous silicon, low-temperature polysilicon or single crystalline silicon has been conventionally developed. The semiconductor device including a channel formed of amorphous silicon or low-temperature polysilicon is formed in a process of 600° C. or lower, and therefore can be formed by use of a glass substrate. Especially, a semiconductor device including a channel formed of amorphous silicon can be formed with a simpler structure and in a process of 400° C. or lower, and therefore can be formed, for example, by use of a large glass substrate referred to as an eighth-generation glass substrate (2160×2460 mm). However, such a semiconductor device including a channel formed of amorphous silicon has a low mobility and is not usable in a driving circuit.

A semiconductor device including a channel formed of low-temperature polysilicon or single crystalline silicon has a higher mobility than the semiconductor device including a channel formed of amorphous silicon, and therefore is usable as a selective transistor and also in a driving circuit. However, such a semiconductor device including a channel formed of low-temperature polysilicon or single crystalline silicon has a complicated structure and needs a complicated process to be manufactured. In addition, such a semiconductor device needs to be formed in a process of 500° C. or higher, and therefore cannot be formed by use of a large glass substrate as described above. A semiconductor device including a channel formed of amorphous silicon, low-temperature polysilicon or single crystalline silicon has a high off-current. In the case where such a semiconductor device is used as a selective transistor, it is difficult to keep the applied voltage for a long time.

For the above-described reasons, a semiconductor device including a channel formed of an oxide semiconductor, instead of amorphous silicon, low-temperature polysilicon or single crystalline silicon, has been progressively developed recently (e.g., Japanese Laid-Open Patent Publication No. 2010-062229). It is known that a semiconductor device including a channel formed of an oxide semiconductor can be formed with a simple structure and in a low-temperature process like a semiconductor device including a channel formed of amorphous silicon, and has a mobility higher than that of a semiconductor device including a channel formed of amorphous silicon. It is also known that such a semiconductor device including a channel formed of an oxide semiconductor has a very low off-current.

However, the mobility of the semiconductor device including a channel formed of an oxide semiconductor is lower than that of the semiconductor device including a channel formed of low-temperature polysilicon or single crystalline silicon. Therefore, in order to provide a higher on-current, the semiconductor device including a channel formed of an oxide semiconductor needs to have a shorter channel length (L length). In order to shorten the channel length of the semiconductor device described in Japanese Laid-Open Patent Publication No. 2010-062229, a distance between a source and a drain needs to be shortened.

The distance between a source and a drain is determined by a photolithography step and an etching step. In the case where patterning is performed by photolithography, size reduction is restricted by the size of a mask patter of an exposure device. Especially in the case where pattering is performed on a glass substrate by photolithography, the minimum size of a mask pattern is about 2 μm, and the reduction in the channel length of the semiconductor device is restricted by such a size of the mask pattern. The channel length of the semiconductor device is restricted by photolithography, and therefore, is influenced by the in-plane variance of the substrate in the photolithography step.

A driving circuit of a semiconductor device is occasionally required to include a transistor having an on-current thereof suppressed low. Such a semiconductor device is required to both of a transistor having a high on-current as described above and a transistor having a low on-current.

SUMMARY

A semiconductor device in an embodiment according to the present invention includes a first transistor including a first electrode, a first insulating layer having a first side wall, a first oxide semiconductor layer on the first side wall, the first oxide semiconductor layer being connected with the first electrode, a first gate electrode facing the first oxide semiconductor layer, a first gate insulating layer between the first oxide semiconductor layer and the first gate electrode, and a second electrode above the first insulating layer, the second electrode being connected with the first oxide semiconductor layer and a second transistor including a third electrode, a fourth electrode separated from the third electrode, a second oxide semiconductor layer between the third electrode and the fourth electrode, the second oxide semiconductor layer being connected with each of the third electrode and the fourth electrode, a second gate electrode facing the second oxide semiconductor layer, and a second gate insulating layer between the second oxide semiconductor layer and the second gate electrode.

DESCRIPTION OF EMBODIMENTS

Figure 1:
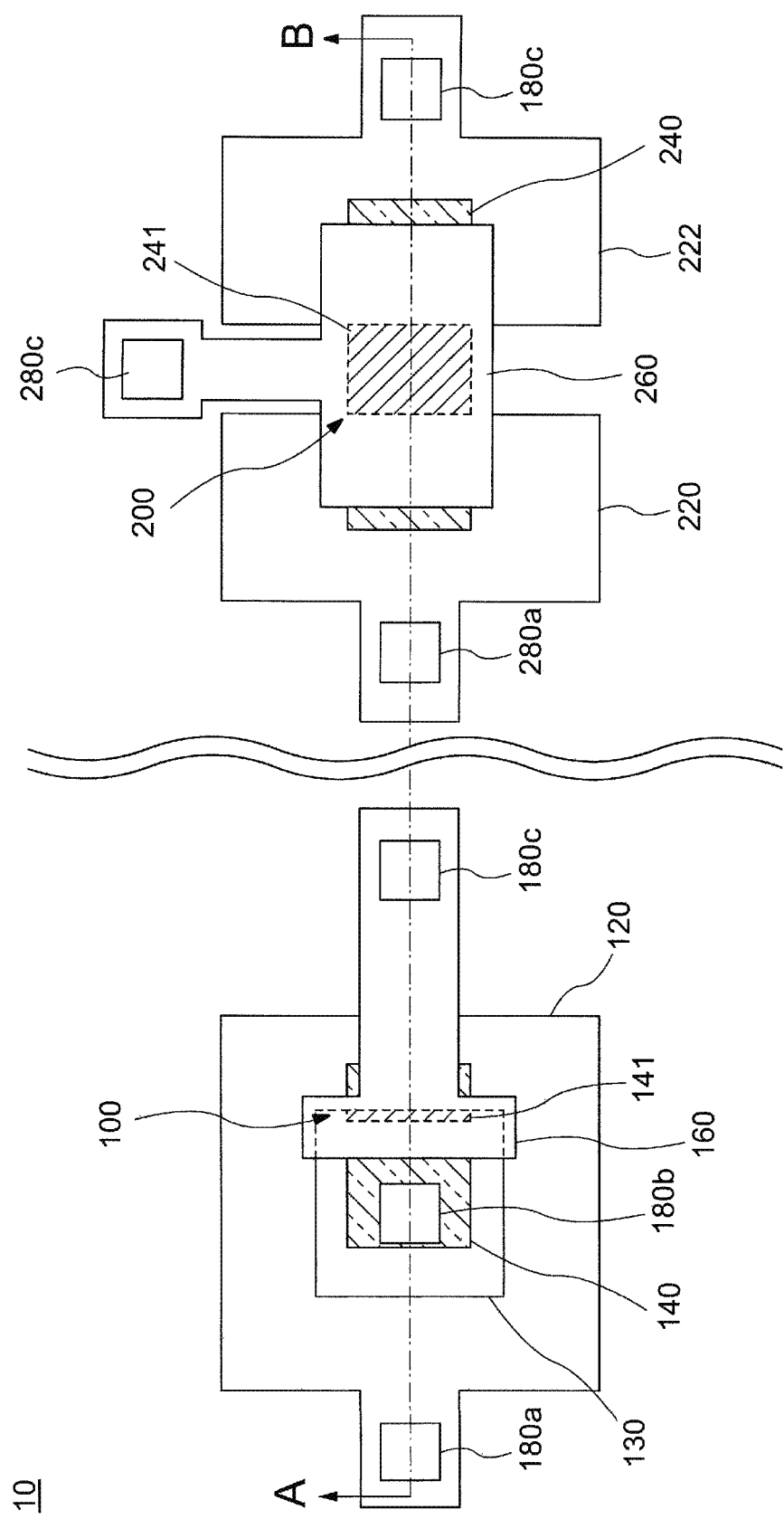
FIG. 1 is a plan view showing an overview of a semiconductor device in an embodiment according to the present invention.

Hereinafter, embodiments of the present invention will be described with reference to the drawings. The disclosure is merely exemplary, and alternations and modifications readily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings are merely exemplary and do not limit the interpretations of the present invention in any way. In the specification and the drawings, components that are substantially the same as those shown in a previous drawing(s) bear the identical reference signs thereto, and detailed descriptions thereof may be omitted. The following embodiments are presented for the purpose of providing a semiconductor device including a plurality of transistors structured differently to have different levels of on-current.

In the following description of the embodiments, the expression that "a first member and a second member are connected with each other" indicates that at least the first member and the second member are electrically connected with each other. Namely, the first member and the second member may be physically connected with each other directly, or another member may be provided between the first member and the second member.

Embodiment 1

Figure 2:
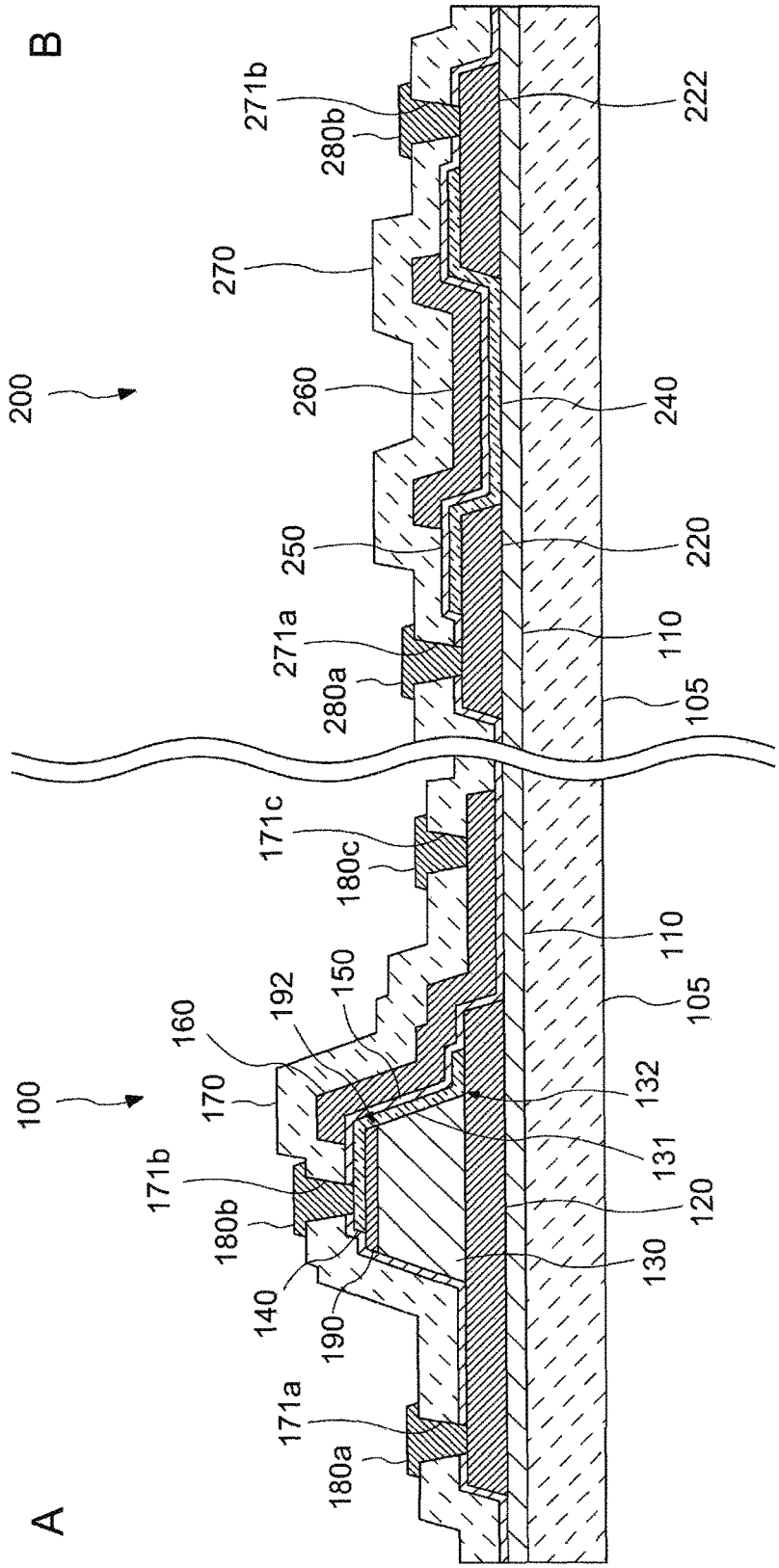
FIG. 2 is a cross-sectional view showing an overview of the semiconductor device in the embodiment according to the present invention.

With reference to FIG. 1 and FIG. 2, an overview of a semiconductor device 10 in embodiment 1 according to the present invention will be described. The semiconductor device 10 in embodiment 1 is usable in a pixel or a driving circuit of a liquid crystal display device (LCD), a spontaneous emission display device using an organic light-emitting diode (OLED) such as an organic EL element, a quantum dot or the like for a display unit, or a reflection-type display device such as an electronic paper or the like.

It should be noted that a semiconductor device according to the present invention is not limited to being used in a display device, and may be used in, for example, an integrated circuit (IC) such as a microprocessing unit (MPU) or the like. The semiconductor device 10 in embodiment 1 is described as having a structure including a channel formed of an oxide semiconductor. The semiconductor device 10 in embodiment 1 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In embodiment 1, the semiconductor device 10 includes transistors. This does not limit the semiconductor device according to the present invention to including transistors.

[Structure of the Semiconductor Device 10]

FIG. 1 is a plan view showing an overview of the semiconductor device 10 in embodiment 1 according to the present invention. FIG. 2 is a cross-sectional view showing an overview of the semiconductor device 10 in embodiment 1 according to the present invention. As shown in FIG. 1 and FIG. 2, the semiconductor device 10 includes a substrate 105, an underlying layer 110 located on the substrate 105, a first transistor 100 and a second transistor 200. The first transistor 100 and the second transistor 200 are located on the underlying layer 110.

The first transistor 100 includes a first lower electrode 120, a first insulating layer 130 located on the first lower electrode 120 and having a first side wall 131, a first assisting electrode 190 located above the first insulating layer 130, and a first oxide semiconductor layer 140 located on the first assisting electrode 190 and the first side wall 131 and connected with the first lower electrode 120 located below the first oxide semiconductor layer 140. The first assisting electrode 190 may be described as being located above the first insulating layer 130 so as to be between the first insulating layer 130 and the first oxide semiconductor layer 140.

The first transistor 100 also includes a first gate electrode 160 located to face the first oxide semiconductor layer 140 and a first gate insulating layer 150 located between the first oxide semiconductor layer 140 and the first gate electrode 160. The first transistor 100 further includes a first interlayer film 170 located on the first gate electrode 160, and first upper electrodes 180a, 180b and 180c respectively connected with the first lower electrode 120, the first oxide semiconductor layer 140 and the first gate electrode 160 through first openings 171a, 171b and 171c provided in the first interlayer film 170. (The first openings 171a, 171b and 171c may be referred to as the "first openings 171" in the case of not being distinguished from each other. The first upper electrodes 180a, 180b and 180c may be referred to as the "first upper electrodes 180" in the case of not being distinguished from each other.) The first upper electrode 180b is connected with the first oxide semiconductor layer 140 above the first insulating layer 130.

The second transistor 200 includes a second lower electrode 220, a third lower electrode 222, a second oxide semiconductor layer 240, a second gate insulating layer 250, and a second gate electrode 260. The second lower electrode 220 and the third lower electrode 222 are formed of the same layer as the first lower electrode 120. The third lower electrode 222 is located to be separate from the second lower electrode 220. The second oxide semiconductor layer 240 is located between the second lower electrode 220 and the third lower electrode 222 and is in contact with a side surface and a top surface of each of the second lower electrode 220 and the third lower electrode 222.

The second gate electrode 260 is located to face the second oxide semiconductor layer 240. The second gate insulating layer 250 is located between the second oxide semiconductor layer 240 and the second gate electrode 260. The second lower electrode 220 and the third lower electrode 222 may be described as being located separately from each other as seen in a plan view. In other words, the second lower electrode 220 and the third lower electrode 222 may be described as being formed to have different patterns from each other.

The second transistor 200 also includes a second interlayer film 270 located on the second gate electrode 260, and second upper electrodes 280 (more specifically, 280a and 280b among the second upper electrodes 280a, 280b and 280c) respectively connected with the second lower electrode 220 and the third lower electrode 222 through second openings 271 (more specifically, 271a and 271b among the second openings 271a, 271b and 271c) provided in the second interlayer film 270. (The second openings 271a, 271b and 271c may be referred to as the "second openings 271" in the case of not being distinguished from each other. The second upper electrodes 280a, 280b and 280c may be referred to as the "second upper electrodes 180" in the case of not being distinguished from each other.)

The second lower electrode 220 and the third lower electrode 222 are formed of the same layer as the first lower electrode 120. The second oxide semiconductor layer 240 is formed of the same layer as the first oxide semiconductor layer 140. The second gate insulating layer 250 is formed of the same layer as the first gate insulating layer 150. The second gate electrode 260 is formed of the same layer as the first gate electrode 160. The semiconductor device 10 is not limited to having the above-described structure, and at least a part of the second oxide semiconductor layer 240 may be formed of the same layer as the first oxide semiconductor layer 140. At least a part of the second gate insulating layer 250 may be formed of the same layer as the first gate insulating layer 150. The second gate electrode 260 may be formed of a different material from that of the first gate electrode 160.

For example, the second oxide semiconductor layer 240 may be formed by stacking another layer on the layer that is the same as the first oxide semiconductor layer 140. Namely, the second oxide semiconductor layer 240 may be thicker than the first oxide semiconductor layer 140. Oppositely, the second oxide semiconductor layer 240 may be thinner than the first oxide semiconductor layer 140. The second gate insulating layer 250 may be formed by stacking another layer on the layer that is the same as the first gate insulating layer 150. Namely, the second gate insulating layer 250 may be thicker than the first gate insulating layer 150. Oppositely, the second gate insulating layer 250 may be thinner than the first gate insulating layer 150.

One of two ends of the first oxide semiconductor layer 140 is connected with the first lower electrode 120 in an region 132, and the other end of the first oxide semiconductor layer 140 is connected with the first assisting electrode 190 in a region 192. The first lower electrode 120 is connected with the first upper electrode 180a, and the first assisting electrode 190 is connected with the first upper electrode 180b with the first oxide semiconductor layer 140 being provided therebetween. The first upper electrode 180b is connected with the first oxide semiconductor layer 140 on the side opposite to the side connected with the first assisting electrode 190. In the case where a source voltage is applied to the first upper electrode 180a and a drain voltage is applied to the first upper electrode 180b, the region 132 may be considered as a source region, and the region 192 may be considered as a drain region.

Namely, in the first transistor 100, the length of a portion of the first oxide semiconductor layer 140 that is located on the first side wall 131 between the first lower electrode 120 and the first assisting electrode 190 is a channel length of the first transistor 100. In the second transistor 200, the length of the second oxide semiconductor layer 240 located between the second lower electrode 220 and the third lower electrode 222 is a channel length of the second transistor 200.

The channel length of the first transistor 100 may be adjusted by the thickness of the first insulating layer 130 and an inclination angle of the first side wall 131. The thickness of the first insulating layer 130 is controllable by a nanometer order, and therefore, the channel length of the first transistor 100 is controllable by a nanometer order. Namely, the first transistor 100 is preferable as a transistor of a short channel length. By contrast, the channel length of the second transistor 200 may be adjusted by the distance between the second lower electrode 220 and the third lower electrode 222.

The distance between second lower electrode 220 and the third lower electrode 222 is controlled by photolithography, and therefore, is controllable by a micrometer order. Namely, the second transistor 200 is preferable as a transistor of a long channel length. In the semiconductor device 10, the channel length of the second transistor 200 may be longer than the channel length of the first transistor 100.

The first side wall 131 may have a tapered inclining surface tending to close upward. Such a shape may be described as being "forward tapered". In this case, the first oxide semiconductor layer 140 may be described as being located on the first side wall 131. The gate insulating layer 150 may be described as being located on the first oxide semiconductor layer 140 on the side wall 131. The first gate electrode 160 may be described as being located on the first gate insulating layer 150 on the side wall 131.

In FIG. 2, the first assisting electrode 190 is shown as covering a top surface of the first insulating layer 130. The first assisting electrode 190 does not need to cover the entirety of the top surface of the first insulating layer 130, and may be located on at least a part of the top surface of the first insulating layer 130. The first assisting electrode 190 may be located on a part of the first side wall 131 in addition to on the top surface of the first insulating layer 130.

The substrate 105 may be formed of glass. Alternatively, the substrate 100 may be formed of a light-transmissive insulating material such as quartz, sapphire, a resin or the like. In the case where the semiconductor device 10 is used in an integrated circuit, not in a display device, the substrate 100 may be formed of a light-non-transmissive material, for example, a semiconductor such as silicon, silicon carbide, a compound semiconductor or the like, or a conductive material such as stainless steel or the like.

The underlying layer 110 may be formed of a material that suppresses diffusion of impurities from the substrate 105 into the first oxide semiconductor layer 140 and the second oxide semiconductor layer 240. For example, the underlying layer 110 may be formed of silicon nitride ($SiN_x$), silicon nitride oxide ($SiN_xO_y$), silicon oxide ($SiO_x$), silicon oxide nitride ($SiO_xN_y$), aluminum nitride ($AlN_x$), aluminum nitride oxide ($AlN_xO_y$), aluminum oxide ($AlO_x$), aluminum oxide nitride ($AlO_xN_y$), or the like (x and y each represent an arbitrary value). Alternatively, the underlying layer 110 may have a structure including a stack of films of such materials.

$SiO_xN_y$ and $AlO_xN_y$ are respectively a silicon compound and an aluminum compound containing nitrogen (N) at a lower content than oxygen (O). $SiN_xO_y$ and $AlN_xO_y$ are respectively a silicon compound and an aluminum compound containing oxygen at a lower content than nitrogen.

The underlying layer 110 described above as an example is formed of a thin film, the thickness of which is controllable by a nanometer order (range less than 1 μm). As a method for controlling the thickness of a thin film by a nanometer order, a PVD (Physical Vapor Deposition) method or a CVD (Chemical Vapor Deposition) method is usable. Examples of the usable PVD method include sputtering, vacuum vapor deposition, electron beam vapor deposition, plating, molecular beam epitaxy, and the like. Examples of the usable CVD method include thermal CVD, plasma CVD, catalyst CVD (catalytic-CVD or hot-wire CVD), and the like. A method other than the above-listed vapor deposition methods may be used as long as the film thickness can be controlled by a nanometer order.

The first lower electrode 120, the second lower electrode 220 and the third lower electrode 222 may be formed of a common metal material or a common conductive semiconductor material. For example, the first lower electrode 120 may be formed of aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt), bismuth (Bi), or the like. Alternatively, the first lower electrode 120 may be formed of an alloy of such materials or a nitride of such materials. Still alternatively, the first lower electrode 120 may be formed of a conductive oxide semiconductor such as ITO (indium tin oxide), IGO (indium gallium oxide), IZO (indium zinc oxide), GZO (zinc oxide containing gallium as a dopant), or the like. The first lower electrode 120 may have a structure including a stack of films of such materials. The first lower electrode 120 may be formed of a thin film, the thickness of which is controllable by a nanometer order, like the underlying layer 110.

Preferably, the material used for the first lower electrode 120 is resistant to a heat treatment in a manufacturing process of a semiconductor device including a channel formed of an oxide semiconductor, and has a low contact resistance with the first oxide semiconductor layer 140. As a material having a good electric contact with the first oxide semiconductor layer 140, a metal material having a work function smaller than that of the first oxide semiconductor layer 140 is usable.

The first insulating layer 130 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110. Alternatively, the first insulating layer 130 may be formed of an organic insulating material such as a polyimide resin, an acrylic resin, an epoxy resin, a silicone resin, a fluorine resin, a siloxane resin, or the like. The first insulating layer 130 may be formed by substantially the same method as that of the underlying layer 110. The first insulating layer 130 and the underlying layer 110 may be formed of the same material as, or different materials from, each other.

In the example shown in FIG. 2, the first insulating layer 130 has a cross-section with the forward tapered first side wall 131 being linear. The first insulating layer 130 is not limited to having this structure. The forward tapered first side wall 131 may be curved as protruding outward or curved as protruding inward. Instead of being forward tapered, the first side wall 131 may be vertical with respect to the surface of the substrate 100, or reverse tapered, namely, incline while tending to close downward.

In the example shown in FIG. 2, the second insulating layer 130 is formed of a single layer. The first insulating layer 130 is not limited to having this structure, and may include a stack of a plurality of layers. In the case where the first insulating layer 130 includes a stack structure, an inclination angle (tapering angle) and the shape of the first side wall 131 may be different layer by layer. Alternatively, the first insulating layer 130 may include a stack of layers of different properties (e.g., $SiN_x$ and $SiO_x$) such that different portions, along the first side wall 131, of the first oxide semiconductor layer 140 have different properties. Namely, the first transistor 100 may have a channel formed of portions of the first oxide semiconductor layer 140 that are of different characteristics and are connected to each other in series.

The first oxide semiconductor layer 140 and the second oxide semiconductor layer 240 may be formed of a metal oxide material having the characteristics of a semiconductor. For example, the first oxide semiconductor layer 140 and the second oxide semiconductor layer 240 may be formed of an oxide semiconductor containing indium (In), gallium (Ga), Zinc (Zn) and oxygen (O). Especially, the first oxide semiconductor layer 140 and the second oxide semiconductor layer 240 may be formed of an oxide semiconductor having a composition ratio of In:Ga:Zn:O=1:1:1:4. It should be noted that the oxide semiconductor used in the present invention and containing In, Ga, Zn and O is not limited to having the above-described composition ratio. An oxide semiconductor having a different composition ratio is also usable. For example, in order to improve the mobility, the ratio of In may be increased. In order to increase the bandgap and thus decrease the influence of light, the ratio of Ga may be increased.

The oxide semiconductor containing In, Ga, Zn and O may contain another element added thereto. For example, a metal element such as Al, Sn or the like may be added. Instead of the above-described oxide semiconductor, zinc oxide (ZnO), nickel oxide (NiO), tin oxide ($SnO_2$), titanium oxide ($TiO_2$), vanadium oxide ($VO_2$), indium oxide ($In_2O_3$), strontium titanate ($SrTiO_3$), or the like may be used. The first oxide semiconductor layer 140 and the second oxide semiconductor layer 240 may be amorphous or crystalline. Alternatively, the first oxide semiconductor layer 140 and the second oxide semiconductor layer 240 may have a mixed phase of an amorphous phase and a crystalline phase.

The first gate insulating layer 150 and the second gate insulating layer 250 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110 and the first insulating layer 130. The first gate insulating layer 150 and the second gate insulating layer 250 may be formed by substantially the same method as that of the underlying layer 110. The first gate insulating layer 150 and the second gate insulating layer 250 may each have a structure including a stack of films of such materials. The first gate insulating layer 150 and the second gate insulating layer 250 may be formed of the same material as, or different materials from, the underlying layer 110 and the first insulating layer 130.

The first gate electrode 160 and the second gate electrode 260 may each be formed of any of substantially the same materials as those described above regarding the first lower electrode 120, the second lower electrode 220 and the third lower electrode 222. The first gate electrode 160 and the second gate electrode 260 may be formed of the same material as, or a different material from, that of the first lower electrode 120. Preferably, the material used for the first gate electrode 160 and the second gate electrode 260 is resistant to a heat treatment in a manufacturing process of a semiconductor device including a channel formed of an oxide semiconductor, and has a work function with which the transistor is of an enhancement type that is turned off when the gate electrode is of 0 V.

The first interlayer film 170 and the second interlayer film 270 may be formed of an inorganic insulating material such as $SiO_x$, $SiN_x$, $SiO_xN_y$, $SiN_xO_y$, $AlO_x$, $AlN_x$, $AlO_xN_y$, $AlN_xO_y$, or the like, like the underlying layer 110, the first insulating layer 130 and the first gate insulating layer 150. The first interlayer film 170 and the second interlayer film 270 may be formed by substantially the same method as that of the underlying layer 110. Instead of the above-listed inorganic insulating materials, the first interlayer film 170 and the second interlayer film 270 may be formed of a TEOS layer or an organic insulating material.

The TEOS layer refers to a CVD layer formed of TEOS (Tetra Ethyl Ortho Silicate), and has an effect of alleviating the steps of, and thus flattening, a layer therebelow. The underlying layer 110, the first insulating layer 130, the first gate insulating layer 150 and the second gate insulating layer 250 may be formed of a TEOS layer.

Examples of the usable organic insulating material include a polyimide resin, an acrylic resin, an epoxy resin, a silicone resin, a fluorine resin, a siloxane resin, and the like. The first interlayer film 170 may be formed of a single layer or a stack of films of such materials. For example, the first insulating film 170 may include a stack of an inorganic insulating material and an organic insulating material.

The first upper electrodes 180, the second upper electrodes 280 and the first assisting electrode 190 may each be formed of any of substantially the same materials as those described above regarding the first lower electrode 120, the second lower electrode 220, the third lower electrode 222, the first gate electrode 160 and the second gate electrode 260. The first upper electrodes 180, the second upper electrodes 280 and the first assisting electrode 190 may be formed of a different material from that of the first lower electrode 120, the second lower electrode 220, the third lower electrode 222, the first gate electrode 160 and the second gate electrode 260.

The first upper electrodes 180, the second upper electrodes 280 and the first assisting electrode 190 may be formed of the same material as, or different materials from, each other. The first upper electrodes 180, the second upper electrodes 280 and the first assisting electrode 190 may be formed of copper (Cu), silver (Ag), gold (Au), or the like instead of the above-listed materials regarding the first lower electrode 120, the second lower electrode 220, the third lower electrode 222, the first gate electrode 160 and the second gate electrode 260. Especially in the case where the first upper electrodes 180 and the second upper electrodes 280 are formed of Cu, such a Cu layer may be stacked with a barrier layer of Ti, TiN or the like, which suppresses diffusion of Cu by heat.

Preferably, the material used for the first upper electrodes 180, the second upper electrodes 280 and the first assisting electrode 190 is resistant to a heat treatment in a manufacturing process of a semiconductor device including a channel formed of an oxide semiconductor, and has a low contact resistance with the first oxide semiconductor layer 140 and the second oxide semiconductor layer 240. As a material having a good electric contact with the first oxide semiconductor layer 140 and the second oxide semiconductor layer 240, a metal material having a work function smaller than that of each of the first oxide semiconductor layer 140 and the second oxide semiconductor layer 240 is usable for the first upper electrodes 180, and the second upper electrodes 280, and the first assisting electrode 190. A portion of the first oxide semiconductor 140 that is located between the first upper electrode 180*b* and the first assisting electrode 190 may have a higher conductivity than that of the remaining part of the first oxide semiconductor 140.

[Operation of the Semiconductor Device 10]

An operation of each of the first transistor 100 and the second transistor 200 shown in FIG. 1 and FIG. 2 will be described. The first transistor 100 includes a channel formed of the first oxide semiconductor layer 140. The second 200 includes a channel formed of the second oxide semiconductor layer 240. Hereinafter, the operation of each of the first transistor 100 and the second transistor 200 will be described.

The first transistor 100 is operated as follows. The first upper electrode 180*c* connected with the first gate electrode 160 is supplied with a gate voltage. The first upper electrode 180*a* connected with the first lower electrode 120 is supplied with a drain voltage. The first upper electrode 180*b* connected with the first oxide semiconductor layer 140 is supplied with a source voltage. It should be noted that the source voltage and the drain voltage may be applied oppositely. The source voltage applied to the first upper electrode 180*b* is supplied to the first assisting electrode 190 via the first oxide semiconductor layer 140.

When the gate voltage is applied to the first gate electrode 160, an electric field in accordance with the gate voltage is generated in the first oxide semiconductor layer 140 facing the first gate electrode 160 with the first gate insulating layer 150 being located therebetween. The electric field generates carriers in the first oxide semiconductor layer 140. When a potential difference is caused between the first lower electrode 120 and the first assisting electrode 190 in the state where the carriers are generated in the first oxide semiconductor layer 140 as described above, the carriers generated in the first oxide semiconductor layer 140 are transferred in accordance with the potential difference. Namely, electrons are transferred from the first assisting electrode 190 to the first lower electrode 120.

The first lower electrode 120 and the first assisting electrode 190 each have a higher conductivity than that of the first oxide semiconductor layer 140, in which the carriers are generated. Therefore, the electrons are supplied to the first oxide semiconductor layer 140 in the source region 192 and are extracted to the first lower electrode 120 in the drain region 132. Namely, in the first transistor 100, the portion of the first oxide semiconductor layer 140 that is located on the first side wall of the first insulating layer 130 acts as the channel. In FIG. 1, reference sign 141 represents the channel region. Thus, the channel length of the first transistor 100 is determined by the thickness of the first insulating layer 130 and the tapering angle of the first side wall 131.

The second transistor 200 is operated as follows. The second upper electrode 280*c* (see FIG. 1) connected with the second gate electrode 260 is supplied with a gate voltage. The second upper electrode 280*a* connected with the second lower electrode 220 is supplied with a drain voltage. The first upper electrode 280*b* connected with the third lower electrode 222 is supplied with a source voltage. It should be noted that the source voltage and the drain voltage may be applied oppositely.

When the gate voltage is applied to the second gate electrode 260, an electric field in accordance with the gate voltage is generated in the second oxide semiconductor layer 240 facing the second gate electrode 260 with the second gate insulating layer 250 being located therebetween. The electric field generates carriers in the second oxide semiconductor layer 240. When a potential difference is caused between the second lower electrode 220 and the third lower electrode 222 in the state where the carriers are generated in the second oxide semiconductor layer 240 as described above, the carriers generated in the second oxide semiconductor layer 240 are transferred in accordance with the potential difference. Namely, electrons are transferred from the third lower electrode 222 to the second lower electrode 220.

In the second transistor 200, the second oxide semiconductor layer 240 located between the second lower electrode 220 and the third lower electrode 222 acts as the channel. In FIG. 1, reference sign 241 represents the channel region. Thus, the channel length of the second transistor 200 is determined by the distance between the second lower electrode 220 and the third lower electrode 222.

As described above, in the semiconductor device 10 in embodiment 1 according to the present invention, the portion of the first oxide semiconductor layer 140 that is located on the first side wall of the first insulating layer 130 acts as the channel of the first transistor 100. Therefore, the channel length of the first transistor 100 is controllable by controlling the thickness of the first insulating layer 130, the tapering angle of the first side wall 131, or both of the thickness of the first insulating layer 130 and the tapering angle of the first side wall 131. As described above, the thickness of the first insulating layer 130 formed by PVD or CVD is controllable by a nanometer order, and therefore, the channel length of the first transistor 100 is controllable by a nanometer order. Thus, the variance of the channel length of the first transistor 100 is smaller than that of the patterning limit of photolithography, which is by a micrometer order. As a result, the first transistor 100 has an improved on-current.

In the meantime, the second oxide semiconductor layer 240 located between the second lower electrode 220 and the third lower electrode 222 acts as the channel of the second transistor 200. Therefore, the channel length of the second transistor 200 is controllable by controlling the pattern of each of the second lower electrode 220 and the third lower electrode 222. Namely, the channel length of the second transistor 200 may be adjusted to have a value from several micrometers to several hundred micrometers by appropriately designing a mask used for photolithography.

As described above, the first transistor 100 including a nanometer-order channel length and the second transistor 200 including a micrometer-order channel length are formed by one, same step.

As described above, the thickness of the first insulating layer 130 is controllable by a nanometer order. Therefore, the in-plane variance of the thickness is also controllable by a nanometer order. The tapering angle of the first insulating layer 130 is controllable by the etching rate of, and the retraction amount (described later) of a resist used to form, the first insulating layer 130. The variance of the etching rate and the variance of the retraction amount of the resist are also controllable by substantially the same order as the variance of the thickness of the first insulating layer 130. Therefore, the first transistor 100 suppresses the in-plane variance of the channel length.

In the first transistor 100, the operation of which is significantly influenced by the change in the characteristics, the channel region 141 of the first oxide semiconductor layer 140 is covered with the first gate electrode 160 as seen from above and is covered with the first lower electrode 120 as seen from below. In the case where the first gate electrode 160 and the first lower electrode 120 are formed of a non-light-transmissive metal material, the first oxide semiconductor layer 140 is suppressed from being irradiated with external light. As a result, the change in the characteristics of the first transistor 100 is small even in an environment where the first transistor 100 is irradiated with light.

[Manufacturing Method of the Semiconductor Device 10]

Figure 3:
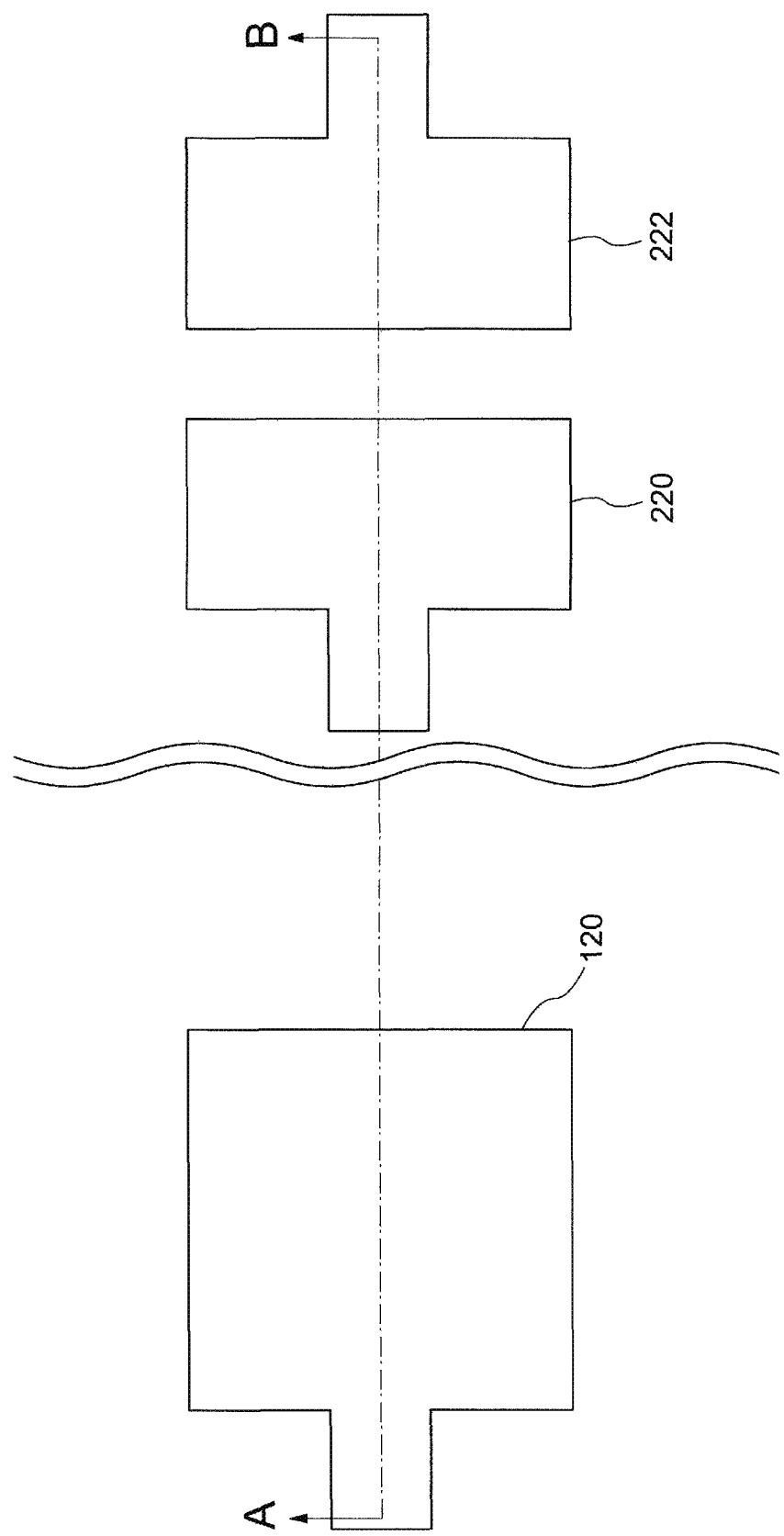
FIG. 3 is a plan view showing a step of forming lower electrodes in a manufacturing method of the semiconductor device in the embodiment according to the present invention.
Figure 4:
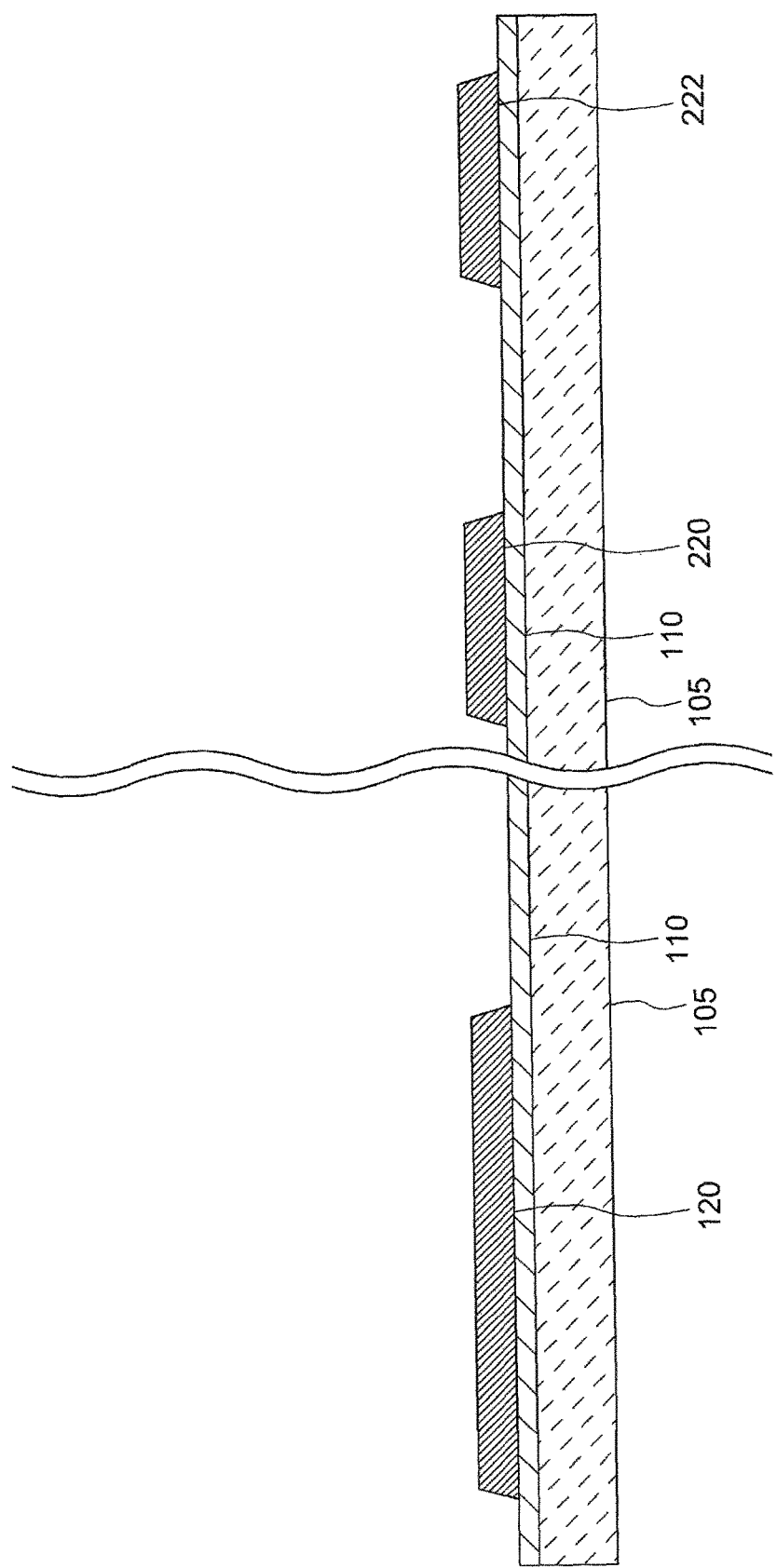
FIG. 4 is a cross-sectional view showing the step of forming the lower electrodes in the manufacturing method of the semiconductor device in the embodiment according to the present invention.

With reference to plan views and cross-sectional views provided in FIG. 3 through FIG. 12, a manufacturing method of the semiconductor device 10 in embodiment 1 according to the present invention will be described. FIG. 3 and FIG. 4 are respectively a plan view and a cross-sectional view showing a step of forming the first lower electrode 120, the second lower electrode 220 and the third lower electrode 222 in the manufacturing method of the semiconductor device 10 in embodiment 1 according to the present invention. Referring to FIG. 4, the underlying layer 110 and a film for the first lower electrode 120, the second lower electrode 220 and the third lower electrode 222 are formed on the substrate 105, and patterning is performed by photolithography and etching to form the first lower electrode 120, the second lower electrode 220 and the third lower electrode 222 as shown in FIG. 3. Preferably, the etching is performed to form the first lower electrode 120, the second lower electrode 220 and the third lower electrode 222 under the condition that the etching rate ratio of the first lower electrode 120, the second lower electrode 220 and the third lower electrode 222 with respect to the underlying layer 110 is high. In this and the following descriptions of manufacturing methods of semiconductor devices in embodiments according to the present invention, an assembly of the substrate 105 and the film(s) formed thereon at each step will be referred to as the "substrate" for the sake of convenience.

Figure 5:
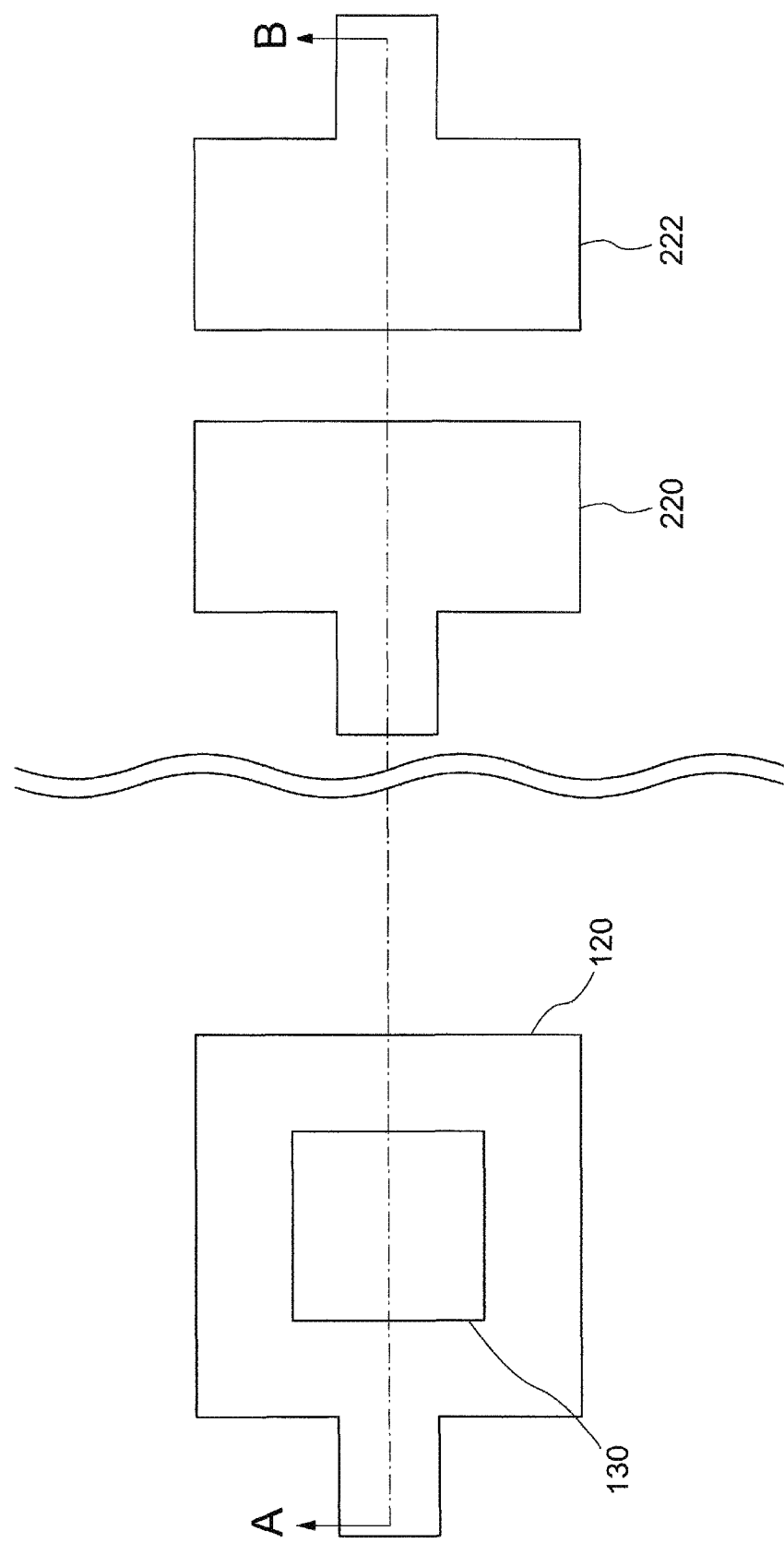
FIG. 5 is a plan view showing a step of forming an insulating layer and an assisting electrode in the manufacturing method of the semiconductor device in the embodiment according to the present invention.
Figure 6:
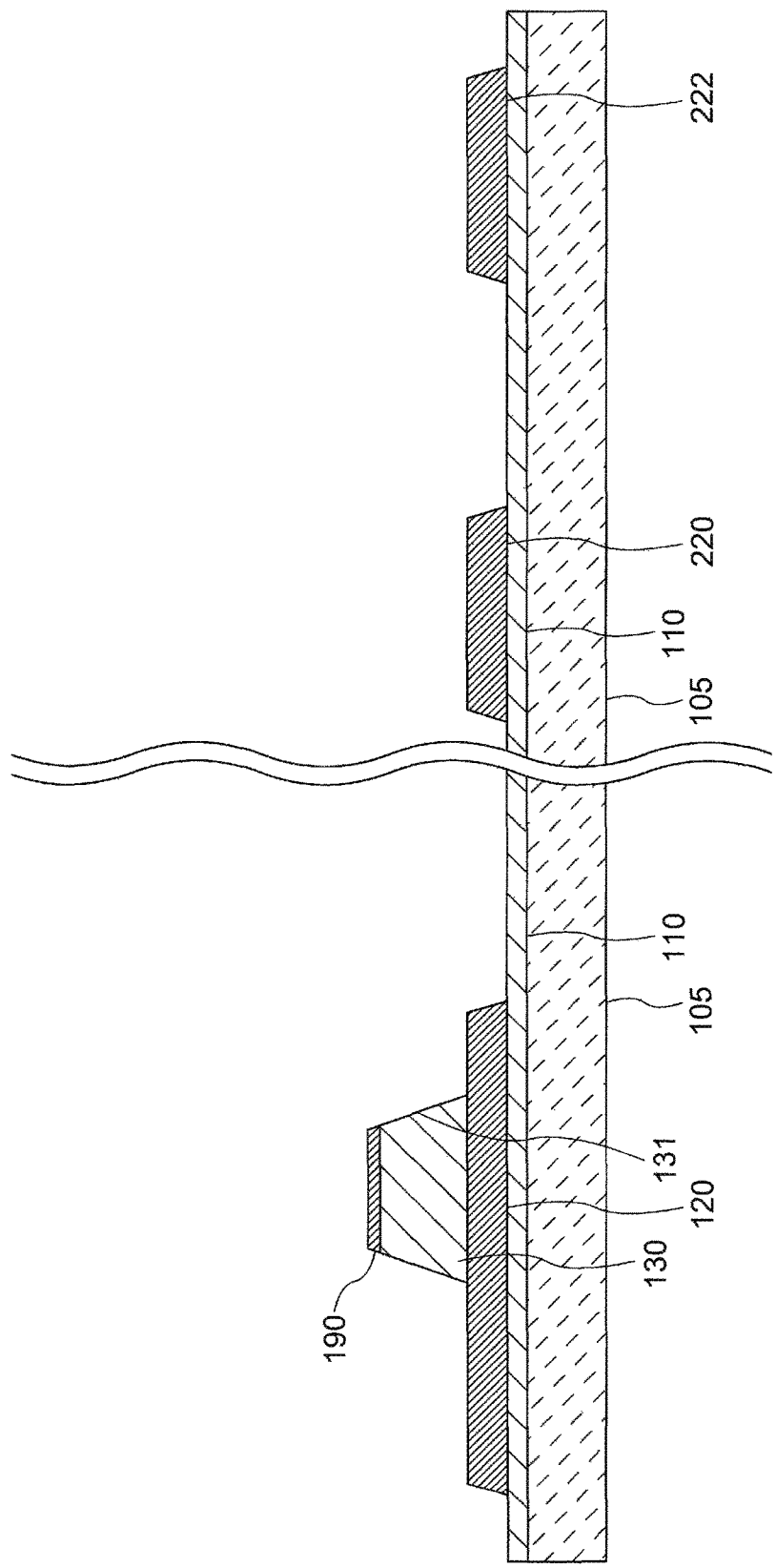
FIG. 6 is a cross-sectional view showing the step of forming the insulating layer and the assisting electrode in the manufacturing method of the semiconductor device in the embodiment according to the present invention.

FIG. 5 and FIG. 6 are respectively a plan view and a cross-sectional view showing a step of forming the first insulating layer 130 and the first assisting electrode 190 in the manufacturing method of the semiconductor device 10 in embodiment 1 according to the present invention. Referring to FIG. 6, a film for the first insulating layer 130 and a film for the first assisting electrode 190 are formed on the entire surface of the substrate shown in FIG. 4, and patterning is performed by photolithography and etching to form the first insulating layer 130 as shown in FIG. 5 and also form the first assisting electrode 190. The first insulating layer 130 and the first assisting electrode 190 may be formed in the same etching step or in different etching steps. For example, after the first insulating layer 130 is formed by patterning, a film for the first assisting electrode 190 may be formed on a top surface and a side surface of the first insulating layer 130, and patterning may be performed by photolithography and etching to form the first assisting electrode 190.

Preferably, the etching is performed to form the first insulating layer 130 under the condition that the etching rate ratio of the first insulating layer 130 with respect to at least the first lower electrode 120, the second lower electrode 220 and the third lower electrode 222 is high. More preferably, the etching is performed to form the first insulating layer 130 under the condition that the etching rate ratio of the first insulating layer 130 with respect to the first lower electrode 120, the second lower electrode 220, the third lower electrode 222 and the underlying layer 110 is high.

In the case where it is difficult to guarantee a high etching rate ratio of the first insulating layer 130 with respect to the underlying layer 110, for example, in the case where the first insulating layer 130 and the underlying layer 110 are formed of the same material, an etching stopper layer may be formed on the underlying layer 110. In the example shown in FIG. 5, the pattern of the first insulating layer 130 is square. The first insulating layer 130 is not limited to being square, and may be of any of various shapes, for example, circular, elliptical, polygonal, curved or the like.

Now, an etching method for forming the first side wall 131 of the first insulating layer 130 to be tapered will be described. The tapering angle of the first side wall 131 may be controlled by the etching rate of the first insulating layer 130 and the etching rate, in a horizontal direction, of a resist used as a mask for forming the first insulating layer 130 by etching (hereinafter, such an etching rate will be referred to as the "retraction amount of the resist"). In the case where, for example, the retraction amount of the resist is smaller than the etching rate of the first insulating layer 130, the tapering angle of the first side wall 131 is large (the first side wall 131 is close to vertical). In the case where the retraction amount of the resist is zero, the first side wall 131 is vertical. By contrast, in the case where the retraction amount of the resist is larger than the etching rate of the first insulating layer 130, the tapering angle of the first side wall 131 is small (the first side wall 131 inclines mildly). The retraction amount of the resist may be adjusted by the tapering angle of an end of the resist or the etching rate of the resist.

Figure 7:
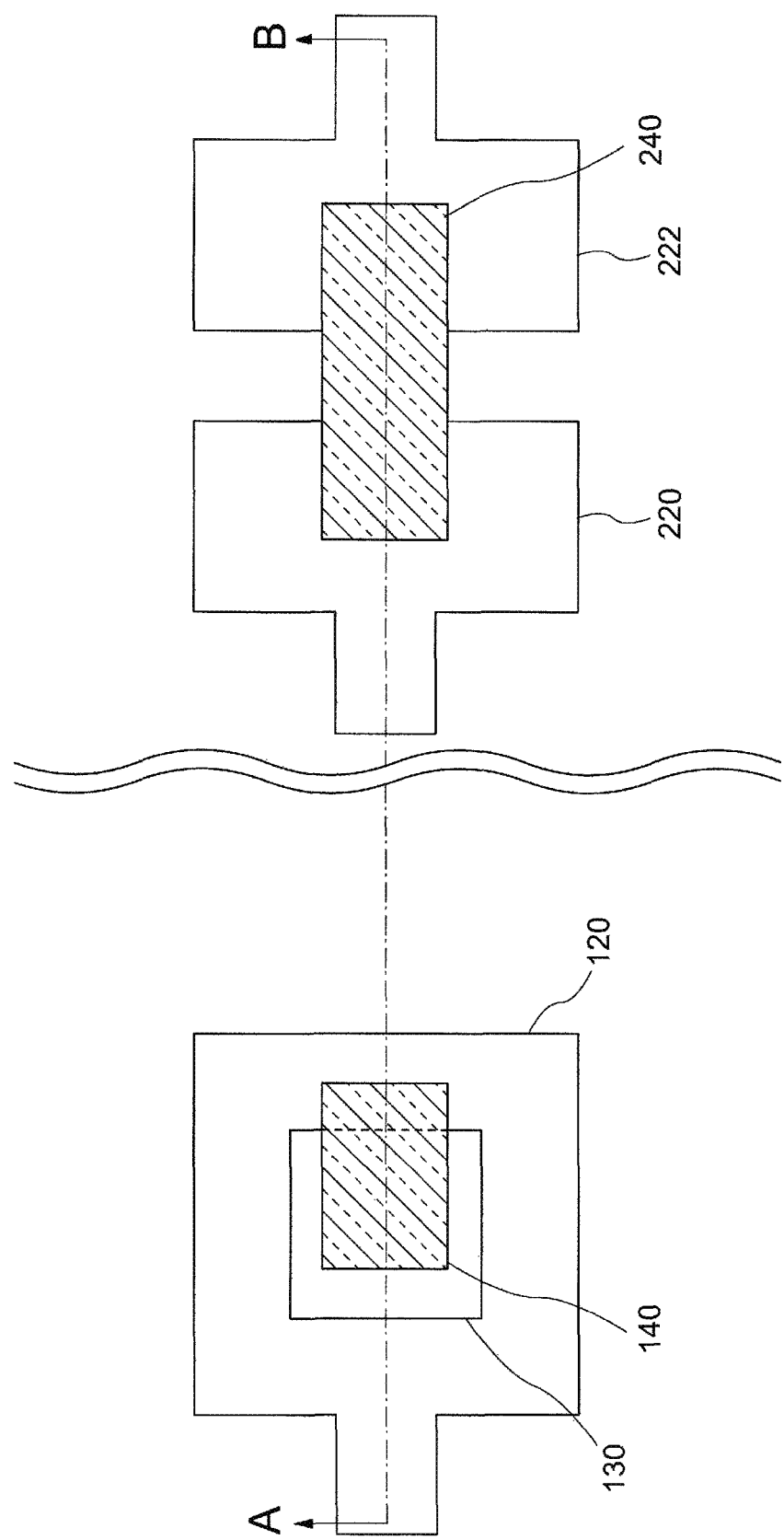
FIG. 7 is a plan view showing a step of forming oxide semiconductor layers in the manufacturing method of the semiconductor device in the embodiment according to the present invention.
Figure 8:
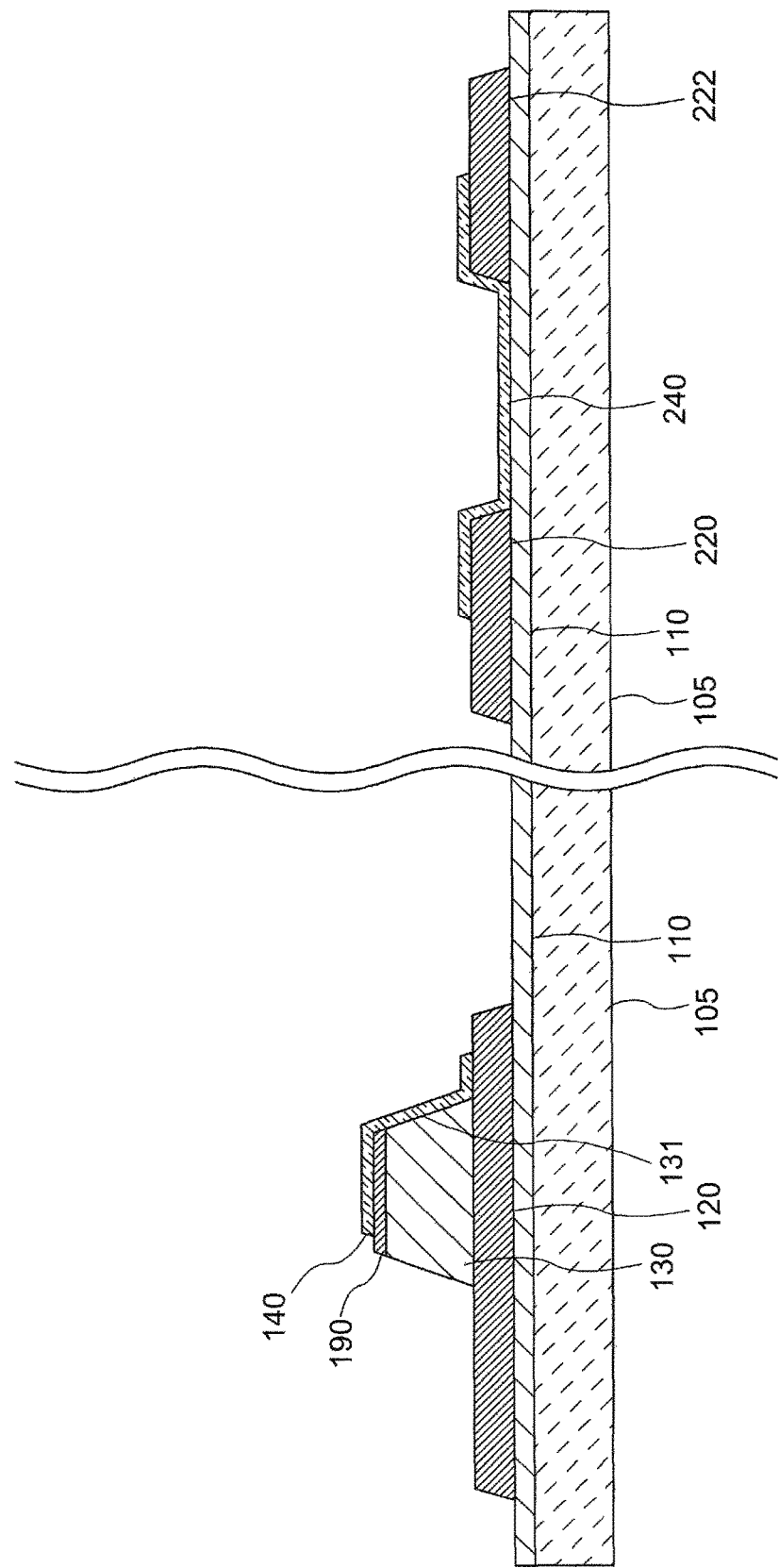
FIG. 8 is a cross-sectional view showing the step of forming the oxide semiconductor layers in the manufacturing method of the semiconductor device in the embodiment according to the present invention.

FIG. 7 and FIG. 8 are respectively a plan view and a cross-sectional view showing a step of forming the first oxide semiconductor layer 140 and the second oxide semiconductor layer 240 in the manufacturing method of the semiconductor device 10 in embodiment 1 according to the present invention. Referring to FIG. 8, a film for the first oxide semiconductor layer 140 and the second oxide semiconductor layer 240 is formed on the entire surface of the substrate shown in FIG. 6, and patterning is performed by photolithography and etching to form the first oxide semiconductor layer 140 and the second oxide semiconductor layer 240 as shown in FIG. 7.

The first oxide semiconductor layer 140 and the second oxide semiconductor layer 240 may be formed by sputtering. The etching performed to form the first oxide semiconductor layer 140 and the second oxide semiconductor layer 240 may be dry etching or wet etching. In the case where the first oxide semiconductor layer 140 and the second oxide semiconductor layer 240 are formed by wet etching, an etchant containing oxalic acid may be used.

In this example, the first oxide semiconductor layer 140 is formed on one side surface of the first insulating layer 130. The first oxide semiconductor layer 140 is not limited to having such a structure, and may be provided, for example, to cover the first insulating layer 130, namely, on all the side surfaces of the first insulating layer 130.

Figure 9:
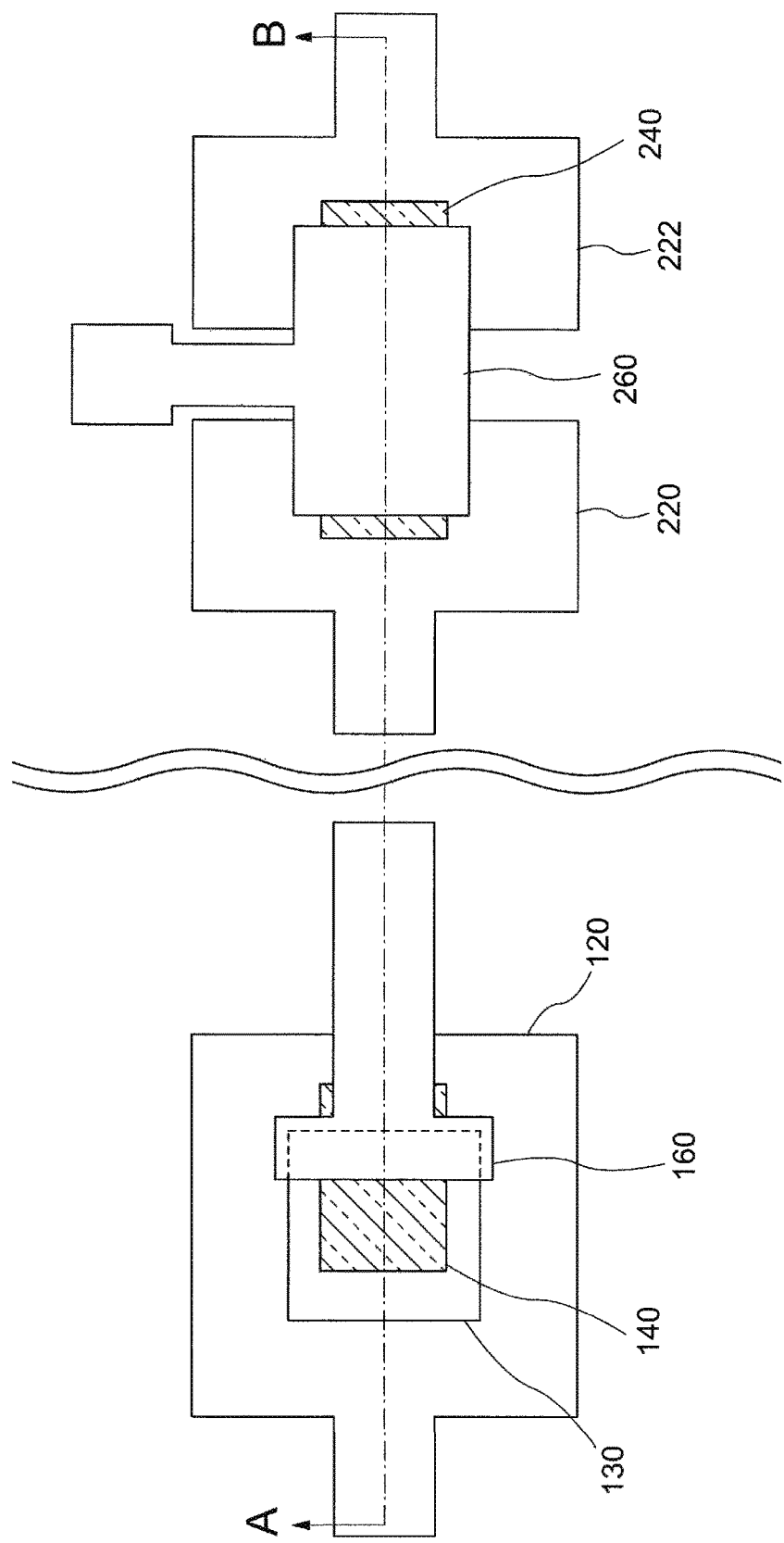
FIG. 9 is a plan view showing a step of forming gate insulating layers and gate electrodes in the manufacturing method of the semiconductor device in the embodiment according to the present invention.
Figure 10:
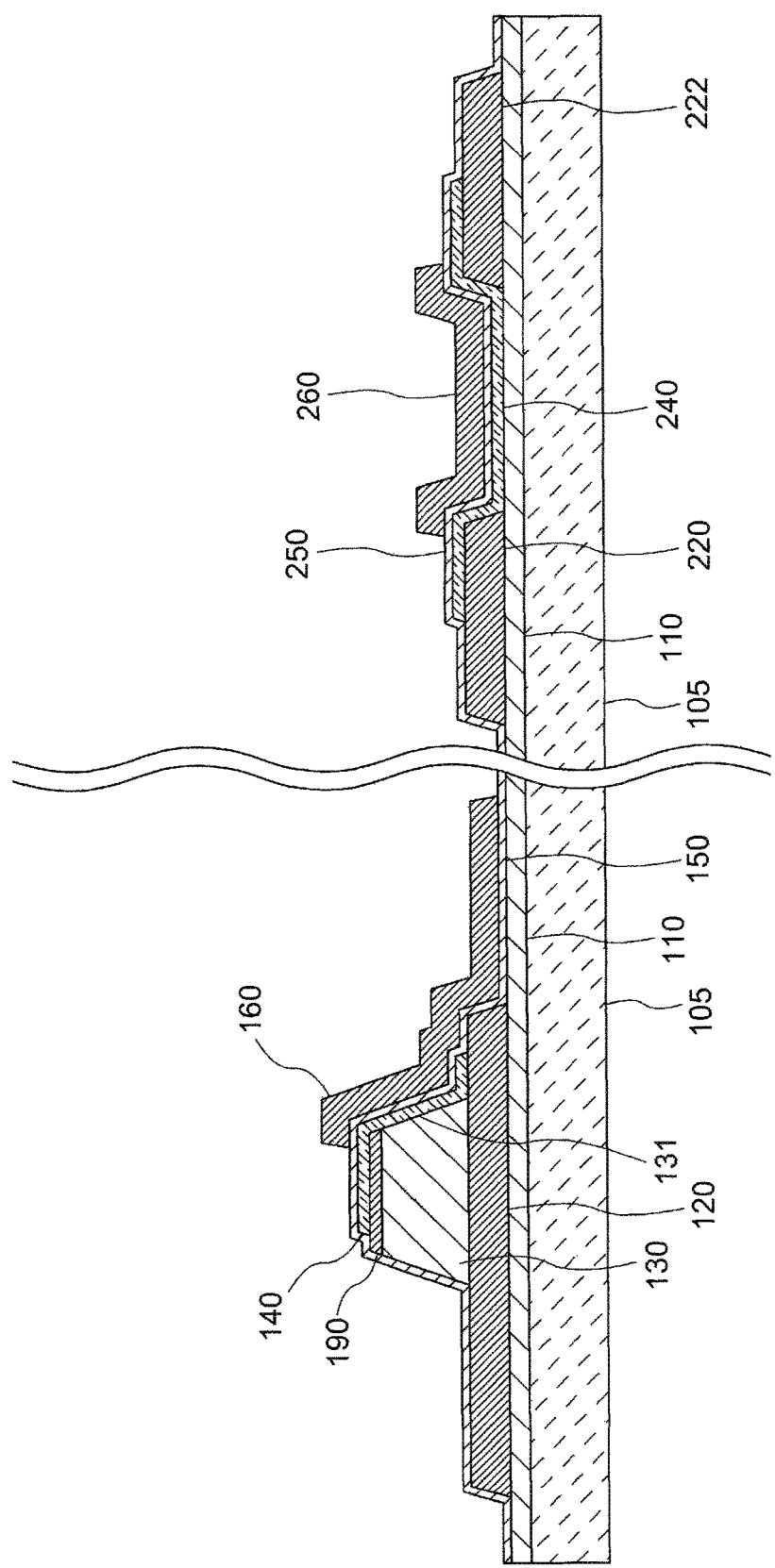
FIG. 10 is a cross-sectional view showing the step of forming the gate insulating layers and the gate electrodes in the manufacturing method of the semiconductor device in the embodiment according to the present invention.

FIG. 9 and FIG. 10 are respectively a plan view and a cross-sectional view showing a step of forming the first gate insulating layer 150, the second gate insulating layer 250, the first gate electrode 160 and the second gate electrode 260 in the manufacturing method of the semiconductor device 10 in embodiment 1 according to the present invention. Referring to FIG. 10, the first gate insulating layer 150, the second gate insulating layer 250, and a film for the first gate electrode 160 and the second gate electrode 260 are formed on the entire surface of the substrate shown in FIG. 8, and patterning is performed by photolithography and etching to form the first gate electrode 160 and the second gate electrode 260 as shown in FIG. 9.

In the example shown in FIG. 10, the first gate insulating layer 150 and the second gate insulating layer 250 respectively act as etching stoppers for the first gate electrode 160 and the second gate electrode 260, so that only the first gate electrode 160 and the second gate electrode 260 are formed by etching. Alternatively, the first gate insulating layer 150, the second gate insulating layer 250, the first gate electrode 160 and the second gate electrode 260 may be formed in one, same etching step.

As shown in FIG. 9, the first gate electrode 160 is formed to cover ends of the first oxide semiconductor layer 140 in a channel width direction (W length) (up-down direction in FIG. 9). In other words, the first gate electrode 160 of the first transistor 100 is longer in the W length than the first oxide semiconductor layer 140. In still other words, the W length of the first gate electrode 160 is longer than the W length of the first oxide semiconductor layer 140 on the first side wall 131. During the etching performed to form the first oxide semiconductor layer 140, the ends of the first oxide semiconductor layer 140 may possibly have properties thereof changed. The first oxide semiconductor layer 140 is shaped as shown in FIG. 9, so that even in the case where the ends thereof have many defects by the influence of the etching, occurrence of leak path, which would otherwise be caused by such defects, is suppressed.

Figure 11:
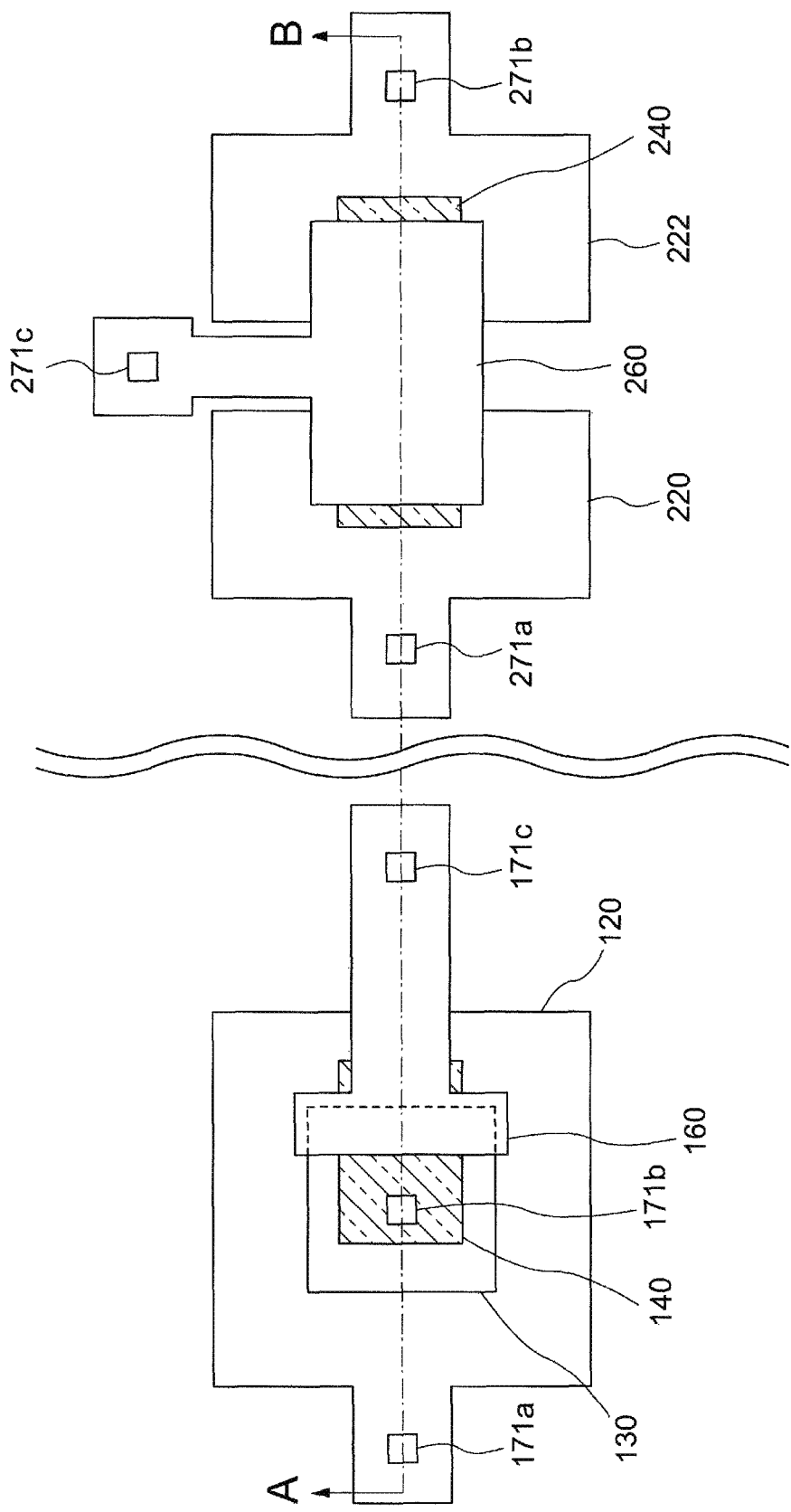
FIG. 11 is a plan view showing a step of forming interlayer films and forming openings in the interlayer films and the gate insulating layers in the manufacturing method of the semiconductor device in the embodiment according to the present invention.
Figure 12:
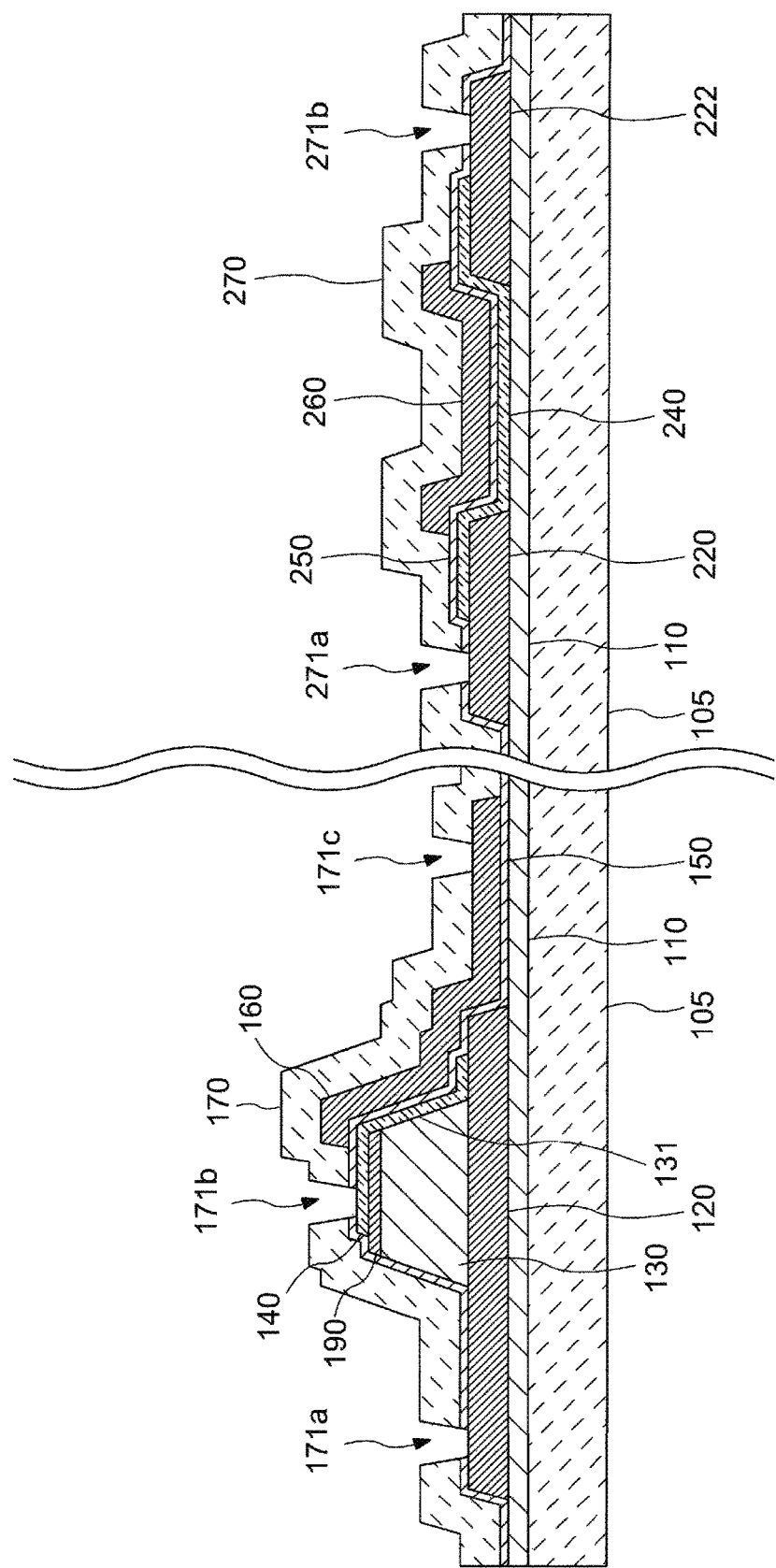
FIG. 12 is a cross-sectional view showing the step of forming the interlayer films and forming the openings in the interlayer films and the gate insulating layers in the manufacturing method of the semiconductor device in the embodiment according to the present invention.

FIG. 11 and FIG. 12 are respectively a plan view and a cross-sectional view showing a step of forming the first interlayer film 170 and the second interlayer film 270, forming the first openings 171 in the first interlayer film 170 and the first gate insulating layer 150, and forming the second openings 271 in the second interlayer film 270 and the second gate insulating layer 250 in the manufacturing method of the semiconductor device 10 in embodiment 1 according to the present invention. Referring to FIG. 12, the first interlayer film 170 and the second interlayer film 270 are formed on the entire surface of the substrate shown in FIG. 10, and patterning is performed by photolithography and etching to form the first openings 171 and the second openings 271 as shown in FIG. 11. The first opening 171a exposes the first lower electrode 120, the first opening 171b exposes the first oxide semiconductor layer 140, and the first opening 171c exposes the first gate electrode 160. The second opening 271a exposes the second lower electrode 220, the second opening 271b exposes the third lower electrode 222, and the second opening 271c (see FIG. 11) exposes the second gate electrode 260.

Preferably, the etching rate ratio of the etching rate to form the first openings 171 and the second openings 271 in the first gate insulating layer 150, the second gate insulating layer 250, the first interlayer film 170 and the second interlayer film 270 with respect to the etching rate of the first lower electrode 120, the second lower electrode 220, the third lower electrode 222, the first oxide semiconductor layer 140, the second oxide semiconductor layer 240, the first gate electrode 160 and the second gate electrode 260 exposed by the first openings 171 and the second openings 271 is high.

Then, a film for the first upper electrodes 180 and the second upper electrodes 280 is formed on the entire surface of the substrate shown in FIG. 12, and patterning is performed to form the first upper electrodes 180 and the second upper electrodes 280 as shown in FIG. 1 and FIG. 2. The semiconductor device 10 in embodiment 1 according to the present invention is manufactured by the manufacturing method described above. Referring to FIG. 2, the portion of the first oxide semiconductor layer 140 that is located on the first side wall 131 is the channel region 141 of the first transistor 100. The second oxide semiconductor layer 240 located between the second lower electrode 220 and the third lower electrode 222 is the channel region 241 of the second transistor 200.

As described above, with the manufacturing method of the semiconductor 10 in embodiment 1 according to the present invention, the first transistor 100 including a nanometer-order channel length and the second transistor 200 including a micrometer-order channel length are formed in one, same step.

Modification 1 of Embodiment 1

Figure 13:
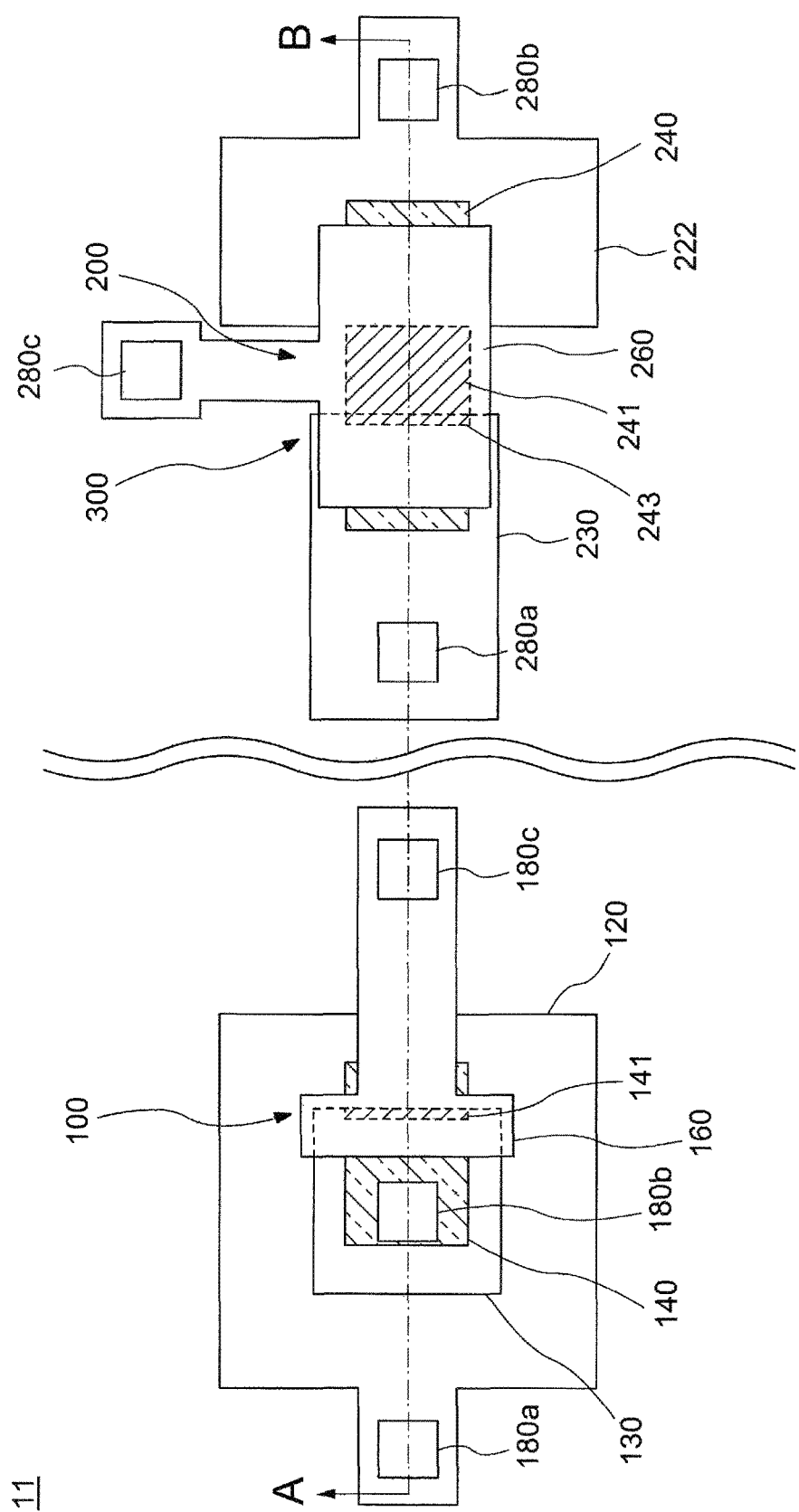
FIG. 13 is a plan view showing an overview of a semiconductor device in an embodiment according to the present invention.
Figure 14:
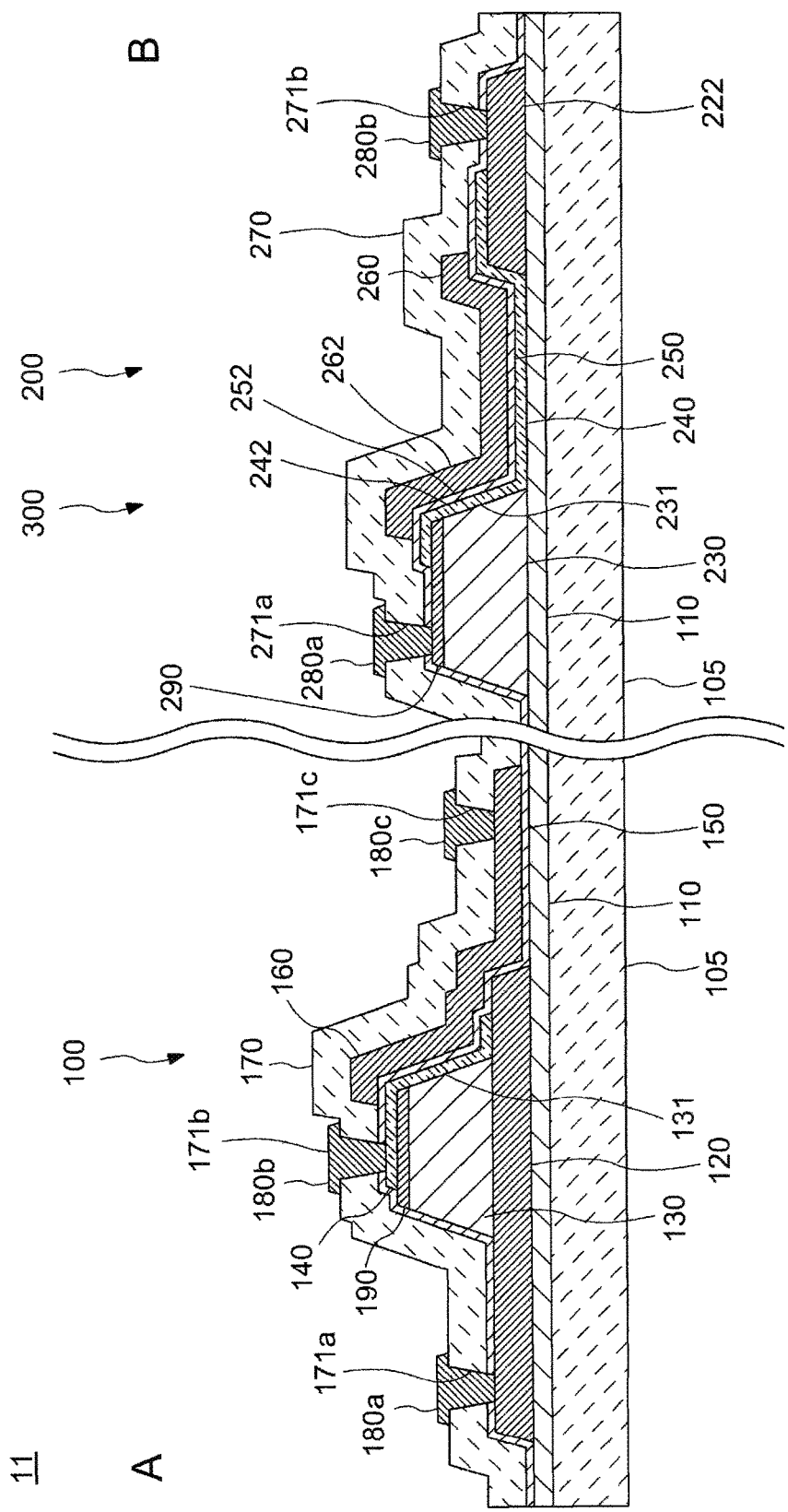
FIG. 14 is a cross-sectional view showing an overview of the semiconductor device in the embodiment according to the present invention.

With reference to FIG. 13 and FIG. 14, modification 1 of embodiment 1 according to the present invention will be described. A semiconductor device 11 in modification 1 of embodiment 1 is similar to the semiconductor device 10 in embodiment 1. In the following description, the components having the identical structures or functions to those of the semiconductor device 10 will bear the identical reference signs thereto, and detailed descriptions thereof will be omitted.

FIG. 13 and FIG. 14 are respectively a plan view and a cross-sectional view showing an overview of the semiconductor device 11 in modification 1 of embodiment 1 according to the present invention. Unlike the semiconductor device 10 shown in FIG. 1 and FIG. 2, the semiconductor device 11 includes a second insulating layer 230 and a second assisting electrode 290 instead of the second lower electrode 220. Specifically, the semiconductor device 11 includes a third transistor 300 in addition to the first transistor 100 and the second transistor 200.

The third transistor 300 is located on the underlying layer 110, and includes the second insulating layer 230 having a second side wall 231, the second assisting electrode 290 located above the second insulating layer 230, and a third oxide semiconductor layer 242 located on the second assisting electrode 290 and the second side wall 231. The third oxide semiconductor layer 242 is connected with the second oxide semiconductor layer 240 located between the second insulating layer 230 and the third lower electrode 222.

The second assisting electrode 290 may be described as being located above the second insulating layer 230 so as to be between the second insulating layer 230 and the third oxide semiconductor layer 242. The semiconductor device 11 also includes a third gate electrode 262 located to face the third oxide semiconductor layer 242 and a third gate insulating layer 252 located between the third oxide semiconductor layer 242 and the third gate electrode 262. In the semiconductor device 11, the second upper electrode 280a is connected with the second assisting electrode 290 through the second opening 271a. The second upper electrode 280b is connected with the third lower electrode 222 through the second opening 271b as in the semiconductor device 10.

The third oxide semiconductor layer 242 is formed of the same layer as the first oxide semiconductor layer 140 and the second oxide semiconductor layer 240. The third gate insulating layer 252 is formed of the same layer as the first gate insulating layer 150 and the second gate insulating layer 250. The third gate electrode 262 is formed of the same layer as the first gate electrode 160 and the second gate electrode 260. It should be noted that the semiconductor device 11 is not limited to having the above-described structure, and at least a part of the third oxide semiconductor layer 242 may be formed of the same layer as the first oxide semiconductor layer 140 or the second oxide semiconductor layer 240. At least a part of the third gate insulating layer 252 may be formed of the same layer as the first gate insulating layer 150 or the second gate insulating layer 250. The third gate electrode 262 may be formed of a different material from that of the first gate electrode 160 or the second gate electrode 260.

As described above, in the semiconductor device 11, the second transistor 200 including a channel formed of the second oxide semiconductor layer 240 located on the underlying layer 110, and the third transistor 300 including a channel formed of a portion of the third oxide semiconductor layer 242 that is located on the second side wall 231, are connected in series. In FIG. 13, reference sign 241 represents the channel region of the second transistor 200, and reference sign 243 represents the channel region of the third transistor 300.

The channel length of the third transistor 300 may be adjusted by the thickness of the second insulating layer 230 and an inclination angle of the second side wall 231. The thickness of the second insulating layer 230 is controllable by a nanometer order, and therefore, the channel length of the third transistor 300 is controllable by a nanometer order. Namely, the third transistor 300 is preferable as a transistor of a short channel length. By contrast, the channel length of the second transistor 200 is controllable by a micrometer order. Therefore, the channel length of the second transistor 200 may be longer than the channel length of the third transistor 300.

In the example shown in FIG. 14, the channel length of the third transistor 300 is equal to the channel length of the first transistor 100. Alternatively, for example, the thickness of the second insulating layer 230 may be made different from the thickness of the first insulating layer 130, or the inclination angle of the second side wall 231 may be made different from the inclination angle of the first side wall 131, so that the channel length of the third transistor 300 is made different from the channel length of the first transistor 100. In the above description, the second transistor 200 and the third transistor 300 are described as being distinguished from each other. Alternatively, the second transistor 200 and the third transistor 300 may be expressed as being one transistor.

Modification 2 of Embodiment 1

Figure 15:
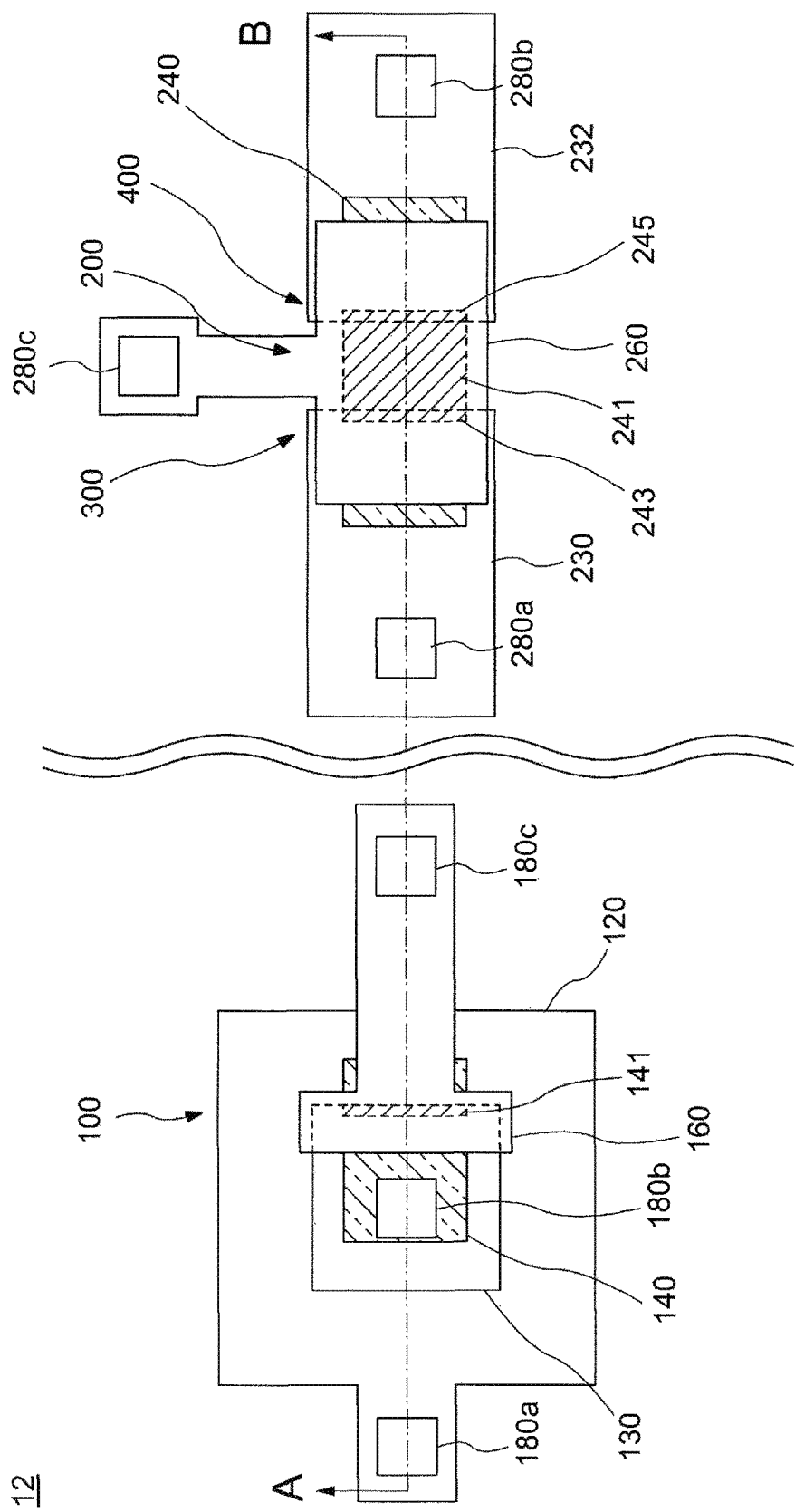
FIG. 15 is a plan view showing an overview of a semiconductor device in an embodiment according to the present invention.
Figure 16:
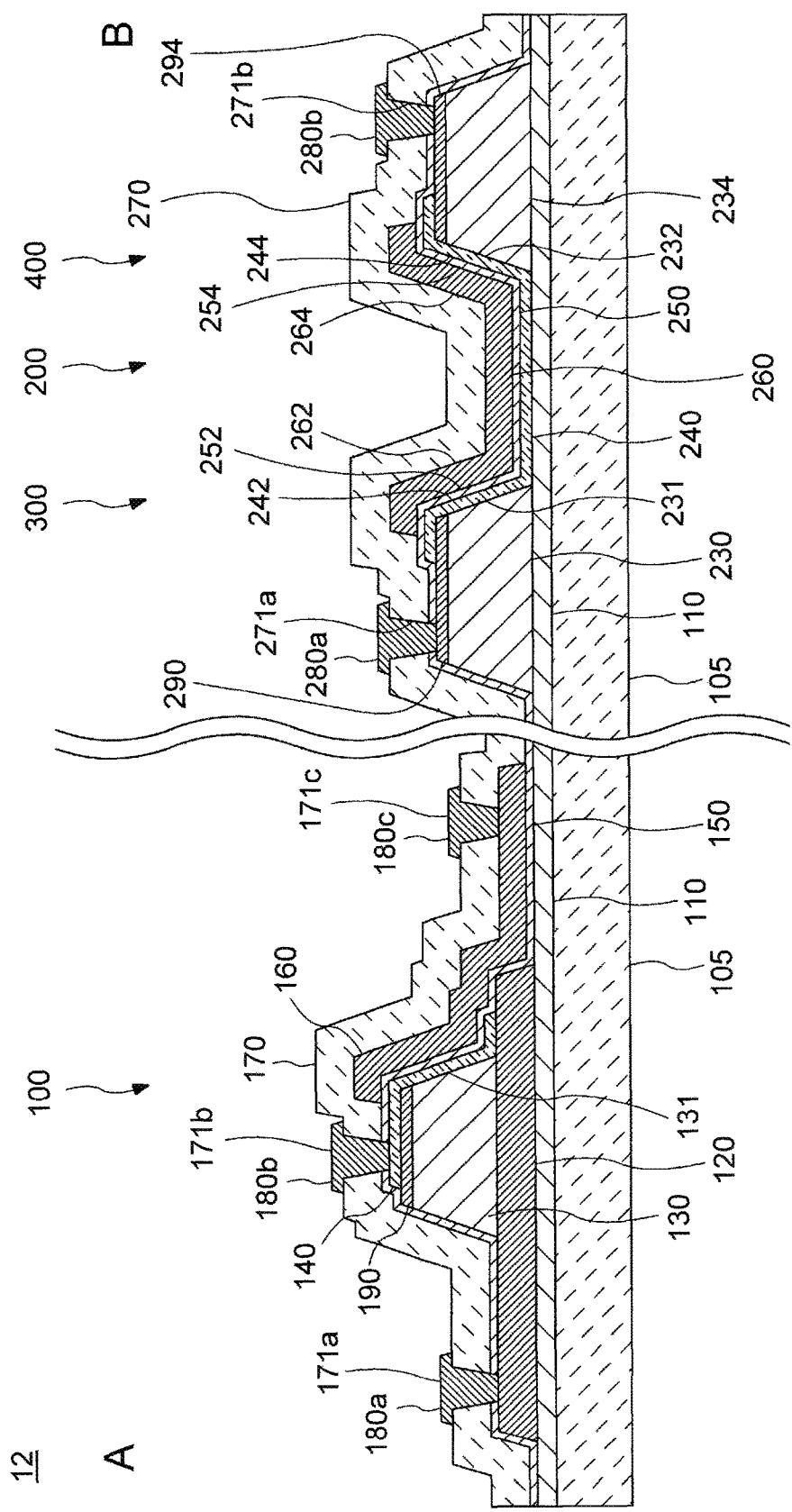
FIG. 16 is a cross-sectional view showing an overview of the semiconductor device in the embodiment according to the present invention.

With reference to FIG. 15 and FIG. 16, modification 2 of embodiment 1 according to the present invention will be described. A semiconductor device 12 in modification 2 of embodiment 1 is similar to the semiconductor device 11 in modification 1 of embodiment 1. In the following description, the components having the identical structures or functions to those of the semiconductor device 11 will bear the identical reference signs thereto, and detailed descriptions thereof will be omitted.

FIG. 15 and FIG. 16 are respectively a plan view and a cross-sectional view showing an overview of the semiconductor device 12 in modification 2 of embodiment 1 according to the present invention. Unlike the semiconductor device 11, the semiconductor device 12 includes a third insulating layer 234 and a third assisting electrode 294 instead of the third lower electrode 222. Specifically, the semiconductor device 12 includes a fourth transistor 400 in addition to the first transistor 100, the second transistor 200 and the third transistor 300. The fourth transistor 400 is located on the underlying layer 110, and includes the third insulating layer 234 located on the underlying layer 110 and having a third side wall 232, the third assisting electrode 294 located above the third insulating layer 234, and a fourth oxide semiconductor layer 244 located on the third assisting electrode 294 and the third side wall 232. The fourth oxide semiconductor layer 244 is connected with the second oxide semiconductor layer 240 located between the second insulating layer 230 and the third insulating layer 234.

The third assisting electrode 294 may be described as being located above the third insulating layer 234 so as to be between the third insulating layer 234 and the fourth oxide semiconductor layer 244. The semiconductor device 12 also includes a fourth gate electrode 264 located to face the fourth oxide semiconductor layer 244 and a fourth gate insulating layer 254 located between the fourth oxide semiconductor layer 244 and the fourth gate electrode 264. In the semiconductor device 12, the second upper electrode 280a is connected with the second assisting electrode 290 through the second opening 271a. The second upper electrode 280b is connected with the third assisting electrode 294 through the second opening 271b.

The fourth oxide semiconductor layer 244 is formed of the same layer as the first oxide semiconductor layer 140, the second oxide semiconductor layer 240 and the third oxide semiconductor layer 242. The fourth gate insulating layer 254 is formed of the same layer as the first gate insulating layer 150, the second gate insulating layer 250 and the third gate insulating layer 252. The fourth gate electrode 264 is formed of the same layer as the first gate electrode 160, the second gate electrode 260 and the third gate electrode 262. It should be noted that the semiconductor device 12 is not limited to having the above-described structure, and at least a part of the fourth oxide semiconductor layer 244 may be formed of the same layer as the first oxide semiconductor layer 140, the second oxide semiconductor layer 240 or the third oxide semiconductor layer 242. At least a part of the fourth gate insulating layer 254 may be formed of the same layer as the first gate insulating layer 150, the second gate insulating layer 250 or the third gate insulating layer 252. The fourth gate electrode 264 may be formed of a different material from that of the first gate electrode 160, the second gate electrode 260 or the third gate electrode 262.

As described above, in the semiconductor device 12, the second transistor 200 including a channel formed of the second oxide semiconductor layer 240 located on the underlying layer 110, the third transistor 300 including a channel formed of a portion of the third oxide semiconductor layer 242 that is located on the second side wall 231, and the fourth transistor 400 including a channel formed of a portion of the fourth oxide semiconductor layer 244 that is located on the third side wall 232, are connected in series. In FIG. 15, reference sign 241 represents the channel region of the second transistor 200, reference sign 243 represents the channel region of the third transistor 300, and reference sign 245 represents the channel region of the fourth transistor 400.

The channel length of the fourth transistor 400 may be adjusted by the thickness of the third insulating layer 234 and an inclination angle of the third side wall 232. The thickness of the second insulating layer 230 is controllable by a nanometer order, and therefore, the channel length of the fourth transistor 400 is controllable by a nanometer order. Namely, the fourth transistor 400 is preferable as a transistor of a short channel length. By contrast, the channel length of the second transistor 200 is controllable by a micrometer order. Therefore, the channel length of the second transistor 200 may be longer than the channel length of the fourth transistor 400.

In the example shown in FIG. 16, the channel length of the fourth transistor 400 is equal to the channel length of the first transistor 100 and the channel length of the third transistor 300. Alternatively, for example, the thickness of the third insulating layer 234 may be made different from the thickness of the first insulating layer 130 or the thickness of the second insulating layer 230, or the inclination angle of the third side wall 232 may be made different from the inclination angle of the first side wall 131 or the inclination angle of the second side wall 231, so that the channel length of the fourth transistor 400 is made different from the channel length of the first transistor 100 or the channel length of the third transistor 300. In the above description, the second transistor 200, the third transistor 300 and the fourth transistor 400 are described as being distinguished from each other. Alternatively, the second transistor 200, the third transistor 300 and the fourth transistor 400 may be expressed as being one transistor.

As described above, the semiconductor devices in the modifications of embodiment 1 according to the present invention each provide substantially the same effect as that of the semiconductor device 10.

Embodiment 2

Figure 17:
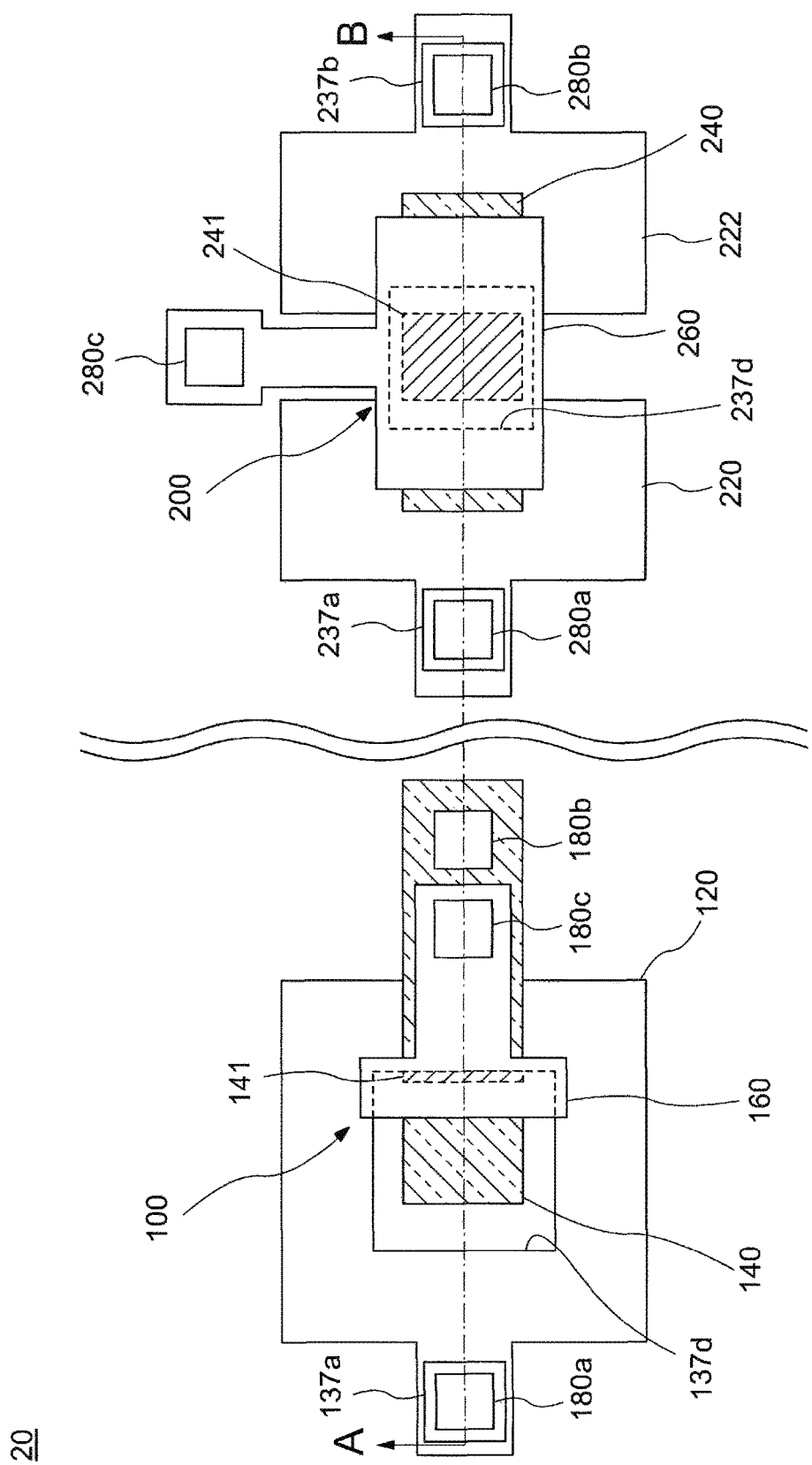
FIG. 17 is a plan view showing an overview of a semiconductor device in an embodiment according to the present invention.
Figure 18:
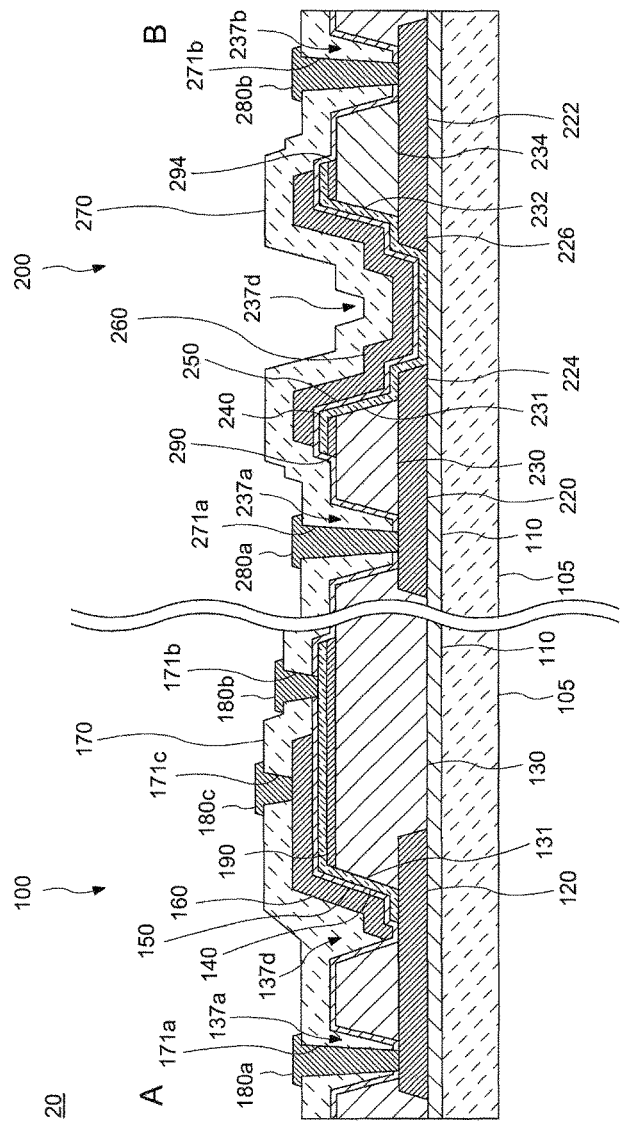
FIG. 18 is a cross-sectional view showing an overview of the semiconductor device in the embodiment according to the present invention.

With reference to FIG. 17 and FIG. 18, an overview of a semiconductor device 20 in embodiment 2 according to the present invention will be described. The semiconductor device 20 in embodiment 2 is usable for a display device, a driving circuit or the like. The semiconductor device 20 in embodiment 2 is described as having a structure including a channel formed of an oxide semiconductor. The semiconductor device 20 in embodiment 2 is not limited to having such a structure, and may include a channel formed of, for example, a semiconductor such as silicon or the like, a compound semiconductor such as Ga—As or the like, or an organic semiconductor such as pentacene, tetracyanoquinodimethane (TCNQ) or the like. In embodiment 2, the semiconductor device 20 includes transistors. This does not limit the semiconductor device according to the present invention to including transistors.

[Structure of the Semiconductor Device 20]

FIG. 17 and FIG. 18 are respectively a plan view and a cross-sectional view showing an overview of the semiconductor device 20 in embodiment 2 according to the present invention. As shown in FIG. 17 and FIG. 18, the semiconductor device 20 includes a substrate 105, an underlying layer 110 located on the substrate 105, a first transistor 100 and a second transistor 200. The first transistor 100 and the second transistor 200 are located on the underlying layer 110.

The first transistor 100 includes a first lower electrode 120, a first insulating layer 130 located on the first lower electrode 120 and having a third opening 137d reaching the first lower electrode 120 and also having a first side wall 131 enclosing the third opening 137d, a first assisting electrode 190 located above the first insulating layer 130, and a first oxide semiconductor layer 140 located on the first assisting electrode 190, the first lower electrode 120 and the first side wall 131 and connected with the first lower electrode 120. The first assisting electrode 190 may be described as being located above the first insulating layer 130 so as to be between the first insulating layer 130 and the first oxide semiconductor layer 140.

The first transistor 100 also includes a first gate electrode 160 located to face the first oxide semiconductor layer 140 and a first gate insulating layer 150 located between the first oxide semiconductor layer 140 and the first gate electrode 150. The first transistor 100 further includes a first interlayer film 170 located on the first gate electrode 160, and first upper electrodes 180a, 180b and 180c respectively connected with the first lower electrode 120, the first oxide semiconductor layer 140 and the first gate electrode 160 through first openings 171a, 171b and 171c provided in the first interlayer film 170. (The first openings 171a, 171b and 171c may be referred to as the "first openings 171" in the case of not being distinguished from each other. The first upper electrodes 180a, 180b and 180c may be referred to as the "first upper electrodes 180" in the case of not being distinguished from each other.) The first upper electrode 180b is connected with the first oxide semiconductor layer 140 above the first insulating layer 130. The first opening 171a is located inside a third opening 137a. Namely, the first upper electrode 180a is connected with the first lower electrode 120 through the first opening 171a and the third opening 137a.

The second transistor 200 includes a second lower electrode 220, a third lower electrode 222, a second insulating layer 230, a third insulating layer 234, a second assisting electrode 290, a third assisting electrode 294, a second oxide semiconductor layer 240, a second gate insulating layer 250, and a second gate electrode 260. The second lower electrode 220 and the third lower electrode 222 are formed of the same layer as the first lower electrode 120. The third lower electrode 222 is located to be separate from the second lower electrode 220.

The second insulating layer 230 is located on the second lower electrode 220. As seen in a plan view, the second lower electrode 220 is larger than the second insulating layer 230, and includes a first protrusion portion 224 protruding from an end of the second insulating layer 230. The third insulating layer 234 is located on the third lower electrode 222. As seen in a plan view, the third lower electrode 222 is larger than the third insulating layer 234, and includes a second protrusion portion 226 protruding from an end of the third insulating layer 234.

The second insulating layer 230 and the third insulating layer 234 have fourth openings 237 (237a, 237b and 273d). The fourth opening 237a reaches the second lower electrode 220, and the fourth opening 237b reaches the third lower electrode 222. The fourth opening 237d reaches the first protrusion portion 224, the second protrusion portion 226 and a portion of the underlying layer 110 between the second lower electrode 220 and the third lower electrode 222.

The second assisting electrode 290 is located on the second insulating layer 230, and the third assisting electrode 294 is located on the third insulating layer 234. The second assisting electrode 290 and the third assisting electrode 294 are located only in an area below the second oxide semiconductor layer 240. Namely, the second assisting electrode 290 and the third assisting electrode 294 are located respectively between the second insulating layer 230 and the second oxide semiconductor layer 240 and between the third insulating layer 234 and the second oxide semiconductor layer 240.

In the fourth opening 273d, the second oxide semiconductor layer 240 is located on the underlying layer 110, the first protrusion portion 224, the second protrusion portion 226, a second side wall 231 of the second insulating layer 230, a third side wall 232 of the third insulating layer 234, the second assisting electrode 290 and the third assisting electrode 294. It is sufficient that the second oxide semiconductor layer 240 is in contact with at least the second lower electrode 220 and the third lower electrode 222 and is located between at least the second lower electrode 220 and the third lower electrode 222.

The second gate electrode 260 is located to face the second oxide semiconductor layer 240. The second gate insulating layer 250 is located between the second oxide semiconductor layer 240 and the second gate electrode 260. The second lower electrode 220 and the third lower electrode 222 may be described as being located separately from each other as seen in a plan view. In other words, the second lower electrode 220 and the third lower electrode 222 may be described as being formed to have different patterns from each other.

The second transistor 200 also includes a second interlayer film 270 located on the second gate electrode 260, and second upper electrodes 280 (more specifically, 280a and 280b among the second upper electrodes 280a, 280b and 280c) respectively connected with the second lower electrode 220 and the third lower electrode 222 through second openings 271 (more specifically, 271a and 271b among the second openings 271a, 271b and 271c) provided in the second interlayer film 270. (The second openings 271a, 271b and 271c may be referred to as the "second openings 271" in the case of not being distinguished from each other. The second upper electrodes 280a, 280b and 280c may be referred to as the "second upper electrodes 180" in the case of not being distinguished from each other.)

The second lower electrode 220 and the third lower electrode 222 are formed of the same layer as the first lower electrode 120. The second oxide semiconductor layer 240 is formed of the same layer as the first oxide semiconductor layer 140. The second gate insulating layer 250 is formed of the same layer as the first gate insulating layer 150. The second gate electrode 260 is formed of the same layer as the first gate electrode 160. The semiconductor device 20 is not limited to having the above-described structure, and at least a part of the second oxide semiconductor layer 240 may be formed of the same layer as the first oxide semiconductor layer 140. At least a part of the second gate insulating layer 250 may be formed of the same layer as the first gate insulating layer 150. The second gate electrode 260 may be formed of a different material from that of the first gate electrode 160.

For example, the second oxide semiconductor layer 240 may be formed by stacking another layer on the layer that is the same as the first oxide semiconductor layer 140. Namely, the second oxide semiconductor layer 240 may be thicker than the first oxide semiconductor layer 140. Oppositely, the second oxide semiconductor layer 240 may be thinner than the first oxide semiconductor layer 140. The second gate insulating layer 250 may be formed by stacking another layer on the layer that is the same as the first gate insulating layer 150. Namely, the second gate insulating layer 250 may be thicker than the first gate insulating layer 150. Oppositely, the second gate insulating layer 250 may be thinner than the first gate insulating layer 150.

In the second semiconductor device 20 in embodiment 2, the second lower electrode 220, the third lower electrode 222, the second insulating layer 230, the third insulating layer 234, the second assisting electrode 290, the third assisting electrode 294, the second oxide semiconductor layer 240, the second gate insulating layer 250, the second gate electrode 260, the second interlayer film 270, and the second upper electrodes 280 may be formed of any of substantially the same materials as those described above regarding those elements in the semiconductor device 10 in embodiment 1.

The operations of the first transistor 100 and the second transistor 200 in the semiconductor device 20 are substantially the same as those of the first transistor 100 and the second transistor 200 in the semiconductor device 10 and thus will not be described.

As described above, with the semiconductor device 20 in embodiment 2 according to the present invention, the first transistor 100 controlling the channel length by a nanometer order and the second transistor 200 controlling the channel length by a micrometer order are formed in one, same step. The first insulating layer 130, the second insulating layer 230 and the third insulating layer 234 need to be etched only in the regions where the first lower electrode 120, the second lower electrode 220 and the third lower electrode 222 need to be exposed to form the openings. Therefore, the load on the etching device is alleviated in the step of etching the first insulating layer 130, the second insulating layer 230 and the third insulating layer 234.

[Manufacturing Method of the Semiconductor Device 20]

Figure 19:
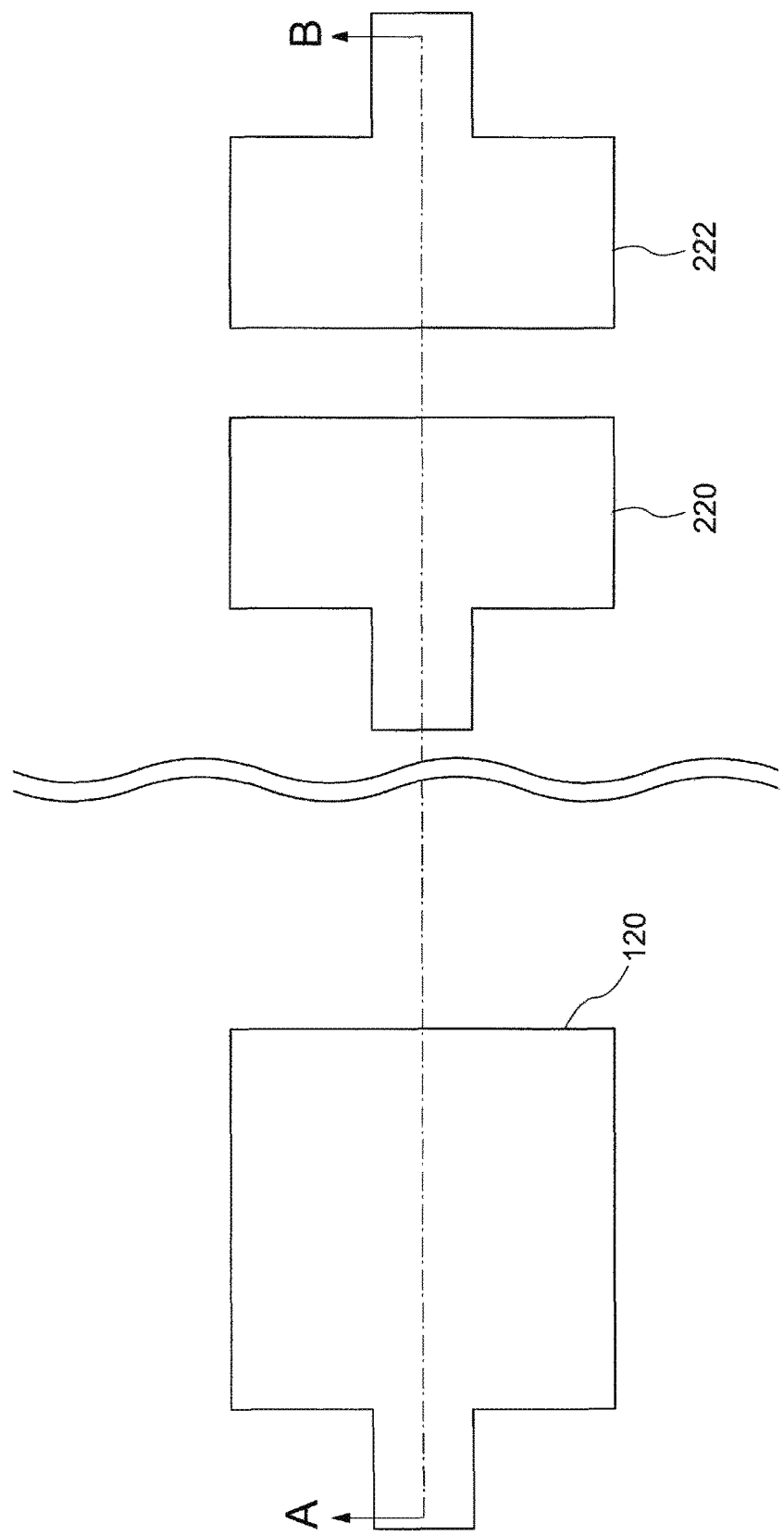
FIG. 19 is a plan view showing a step of forming lower electrodes in a manufacturing method of the semiconductor device in the embodiment according to the present invention.
Figure 20:
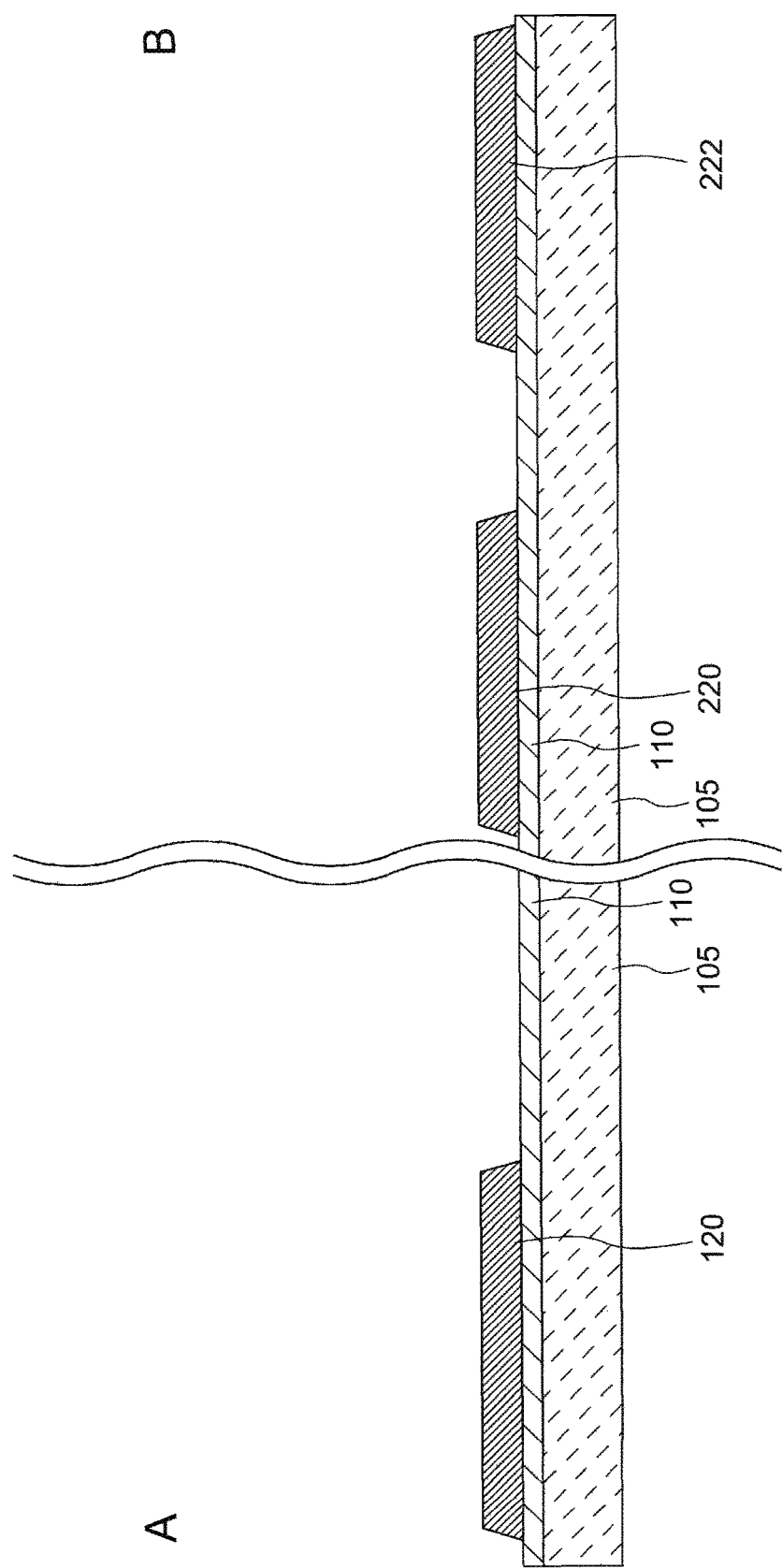
FIG. 20 is a cross-sectional view showing the step of forming the lower electrodes in the manufacturing method of the semiconductor device in the embodiment according to the present invention.

With reference to plan views and cross-sectional views provided in FIG. 19 through FIG. 28, a manufacturing method of the semiconductor device 20 in embodiment 2 according to the present invention will be described. FIG. 19 and FIG. 20 are respectively a plan view and a cross-sectional view showing a step of forming the first lower electrode 120, the second lower electrode 220 and the third lower electrode 222 in the manufacturing method of the semiconductor device 20 in embodiment 2 according to the present invention. Referring to FIG. 20, the underlying layer 110 and a film for the first lower electrode 120, the second lower electrode 220 and the third lower electrode 222 are formed on the substrate 105, and patterning is performed by photolithography and etching to form the first lower electrode 120, the second lower electrode 220 and the third lower electrode 222 as shown in FIG. 19. Preferably, the etching is performed to form the first lower electrode 120, the second lower electrode 220 and the third lower electrode 222 under the condition that the etching rate ratio of the first lower electrode 120, the second lower electrode 220 and the third lower electrode 222 with respect to the underlying layer 110 is high.

Figure 21:
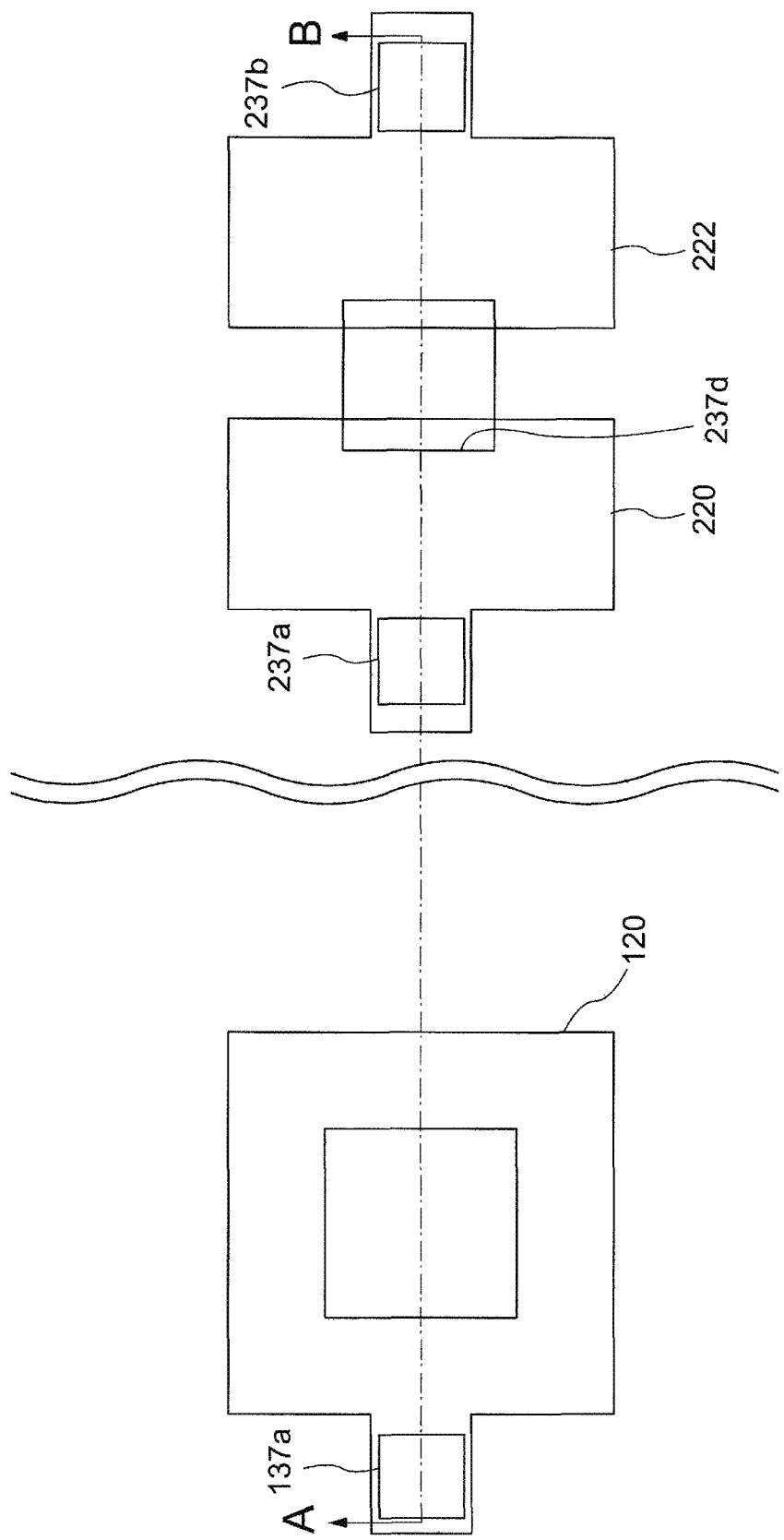
FIG. 21 is a plan view showing a step of forming insulating layers and assisting electrodes in the manufacturing method of the semiconductor device in the embodiment according to the present invention.
Figure 22:
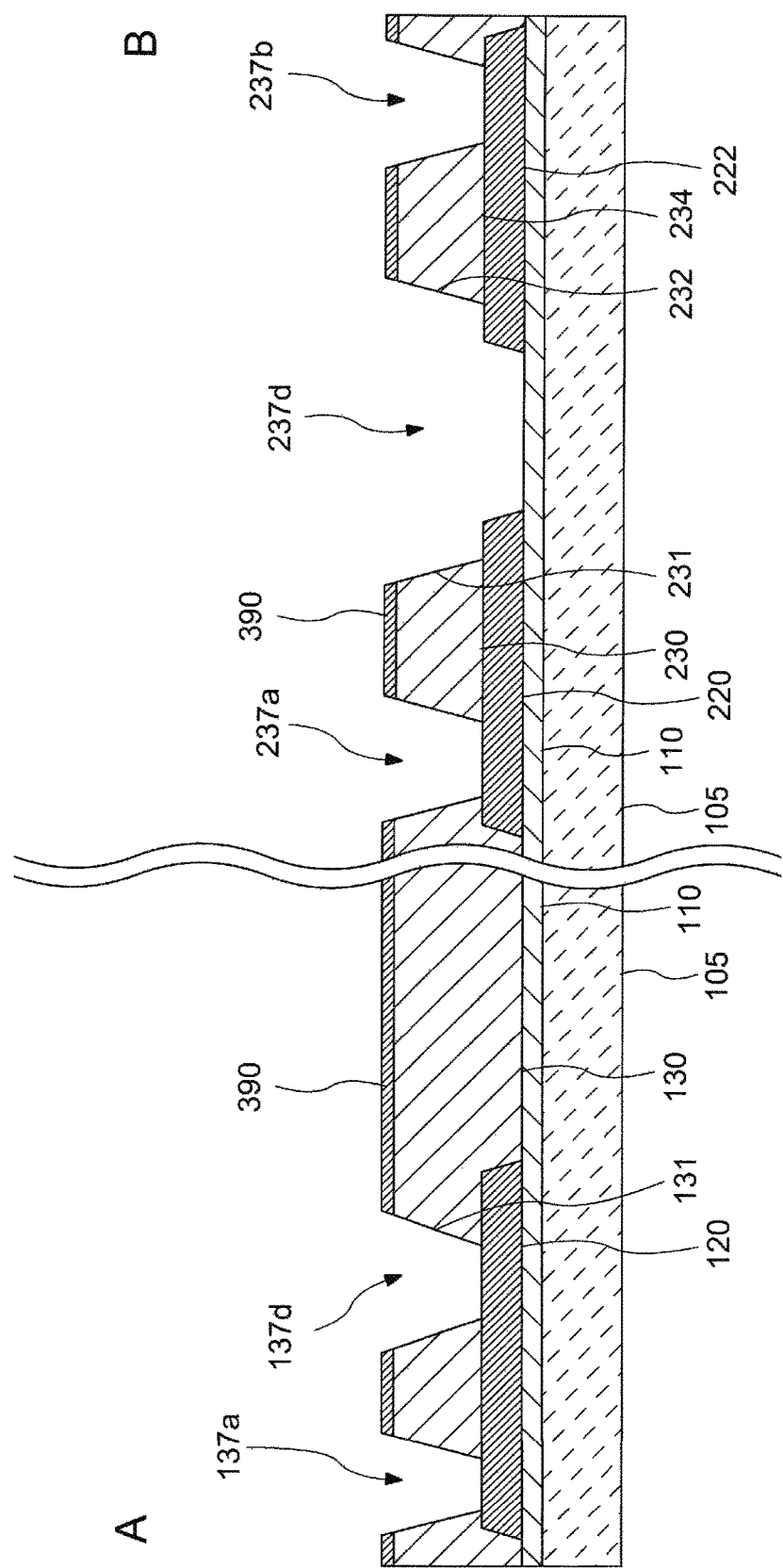
FIG. 22 is a cross-sectional view showing the step of forming the insulating layers and the assisting electrodes in the manufacturing method of the semiconductor device in the embodiment according to the present invention.

FIG. 21 and FIG. 22 are respectively a plan view and a cross-sectional view showing a step of forming the first insulating layer 130, the second insulating layer 230, the third insulating layer 234, the first assisting electrode 190, the second assisting electrode 290 and the third assisting electrode 294 in the manufacturing method of the semiconductor device 20 in embodiment 1 according to the present invention. Referring to FIG. 22, a film for the first insulating layer 130, the second insulating layer 230 and the third insulating layer 234, and a conductive layer 390 are formed on the entire surface of the substrate shown in FIG. 20, and patterning is performed by photolithography and etching to form the first insulating layer 130, the second insulating layer 230, the third insulating layer 234 and the fourth openings 237 as shown in FIG. 21 and FIG. 22. The first insulating layer 130 has the first side wall 131 exposed to the third opening 137d, the second insulating layer 230 has the second side wall 231 exposed to the fourth opening 237d, and the third insulating layer 234 has the third side wall 232 exposed to the fourth opening 237d.

The conductive layer 390 is to be formed into the first assisting electrode 190, the second assisting electrode 290 and the third assisting electrode 294. The first insulating layer 130, the second insulating layer 230, the third insulating layer 234 and the conductive layer 390 may be etched in one, same step, or may be etched in different steps. For example, after the first insulating layer 130, the second insulating layer 230, the third insulating layer 234 are formed by patterning, the conductive layer 390 may be formed on top surfaces and side surfaces of the first insulating layer 130, the second insulating layer 230, the third insulating layer 234 and then patterning may be performed by photolithography and etching to form the first assisting electrode 190, the second assisting electrode 290 and the third assisting electrode 294.

Preferably, the etching is performed to form the first insulating layer 130, the second insulating layer 230 and the third insulating layer 234 under the condition that the etching rate ratio of the first insulating layer 130, the second insulating layer 230 and the third insulating layer 234 with respect to at least the first lower electrode 120, the second lower electrode 220, the third lower electrode 222 and the underlying layer 110 is high. In the case where it is difficult to guarantee a high etching rate ratio of the first insulating layer 130, the second insulating layer 230 and the third insulating layer 234 with respect to the underlying layer 110, for example, in the case where the first insulating layer 130, the second insulating layer 230 and the third insulating layer 234 are formed of the same material as the underlying layer 110, an etching stopper layer may be formed on the underlying layer 110.

Figure 23:
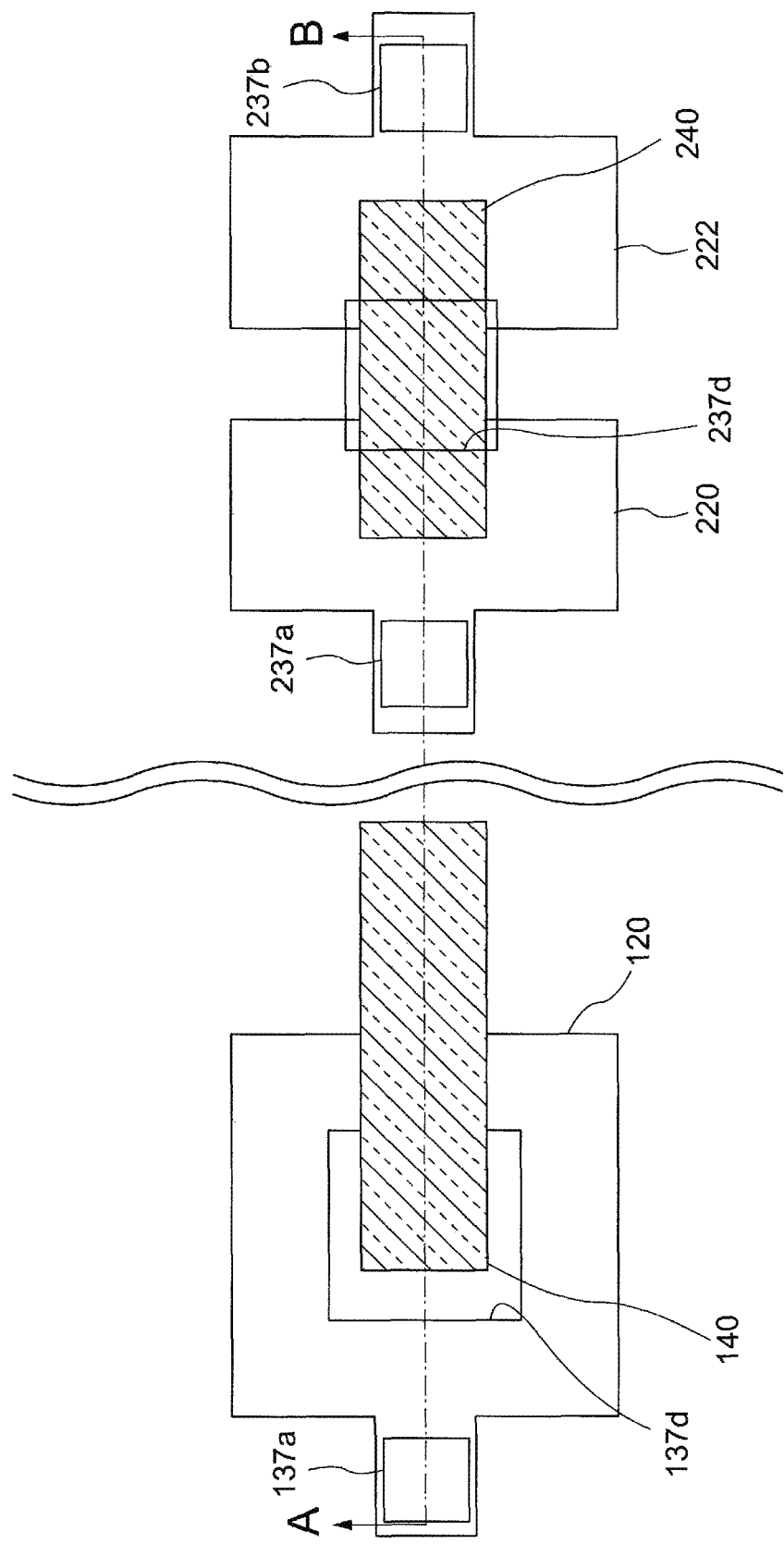
FIG. 23 is a plan view showing a step of forming oxide semiconductor layers in the manufacturing method of the semiconductor device in the embodiment according to the present invention.
Figure 24:
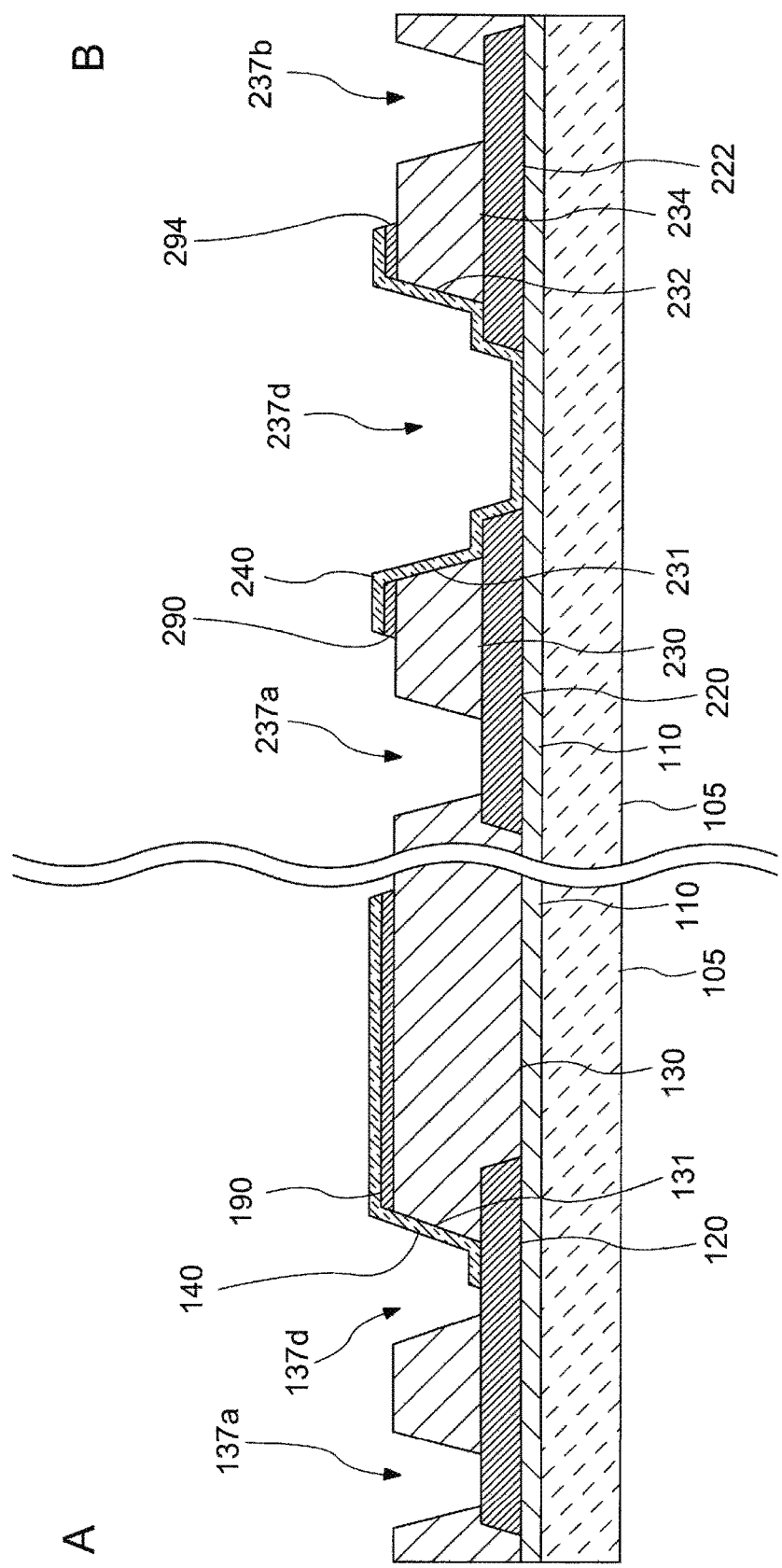
FIG. 24 is a cross-sectional view showing the step of forming the oxide semiconductor layers in the manufacturing method of the semiconductor device in the embodiment according to the present invention.

FIG. 23 and FIG. 24 are respectively a plan view and a cross-sectional view showing a step of forming the first oxide semiconductor layer 140 and the second oxide semiconductor layer 240 in the manufacturing method of the semiconductor device 20 in embodiment 2 according to the present invention. Referring to FIG. 24, a film for the first oxide semiconductor layer 140 and the second oxide semiconductor layer 240 is formed on the entire surface of the substrate shown in FIG. 22, and patterning is performed by photolithography and etching to form the first oxide semiconductor layer 140 and the second oxide semiconductor layer 240 as shown in FIG. 23.

The first oxide semiconductor layer 140 and the second oxide semiconductor layer 240 may be formed by sputtering. The etching performed to form the first oxide semiconductor layer 140 and the second oxide semiconductor layer 240 may be dry etching or wet etching. In the case where the first oxide semiconductor layer 140 and the second oxide semiconductor layer 240 are formed by wet etching, an etchant containing oxalic acid may be used.

In this example, the first oxide semiconductor layer 140 is formed on one side surface of the first insulating layer 130. The first oxide semiconductor layer 140 is not limited to having such a structure, and may be provided, for example, to cover the third opening 137d, namely, on all the side surfaces of the first insulating layer 130.

Figure 25:
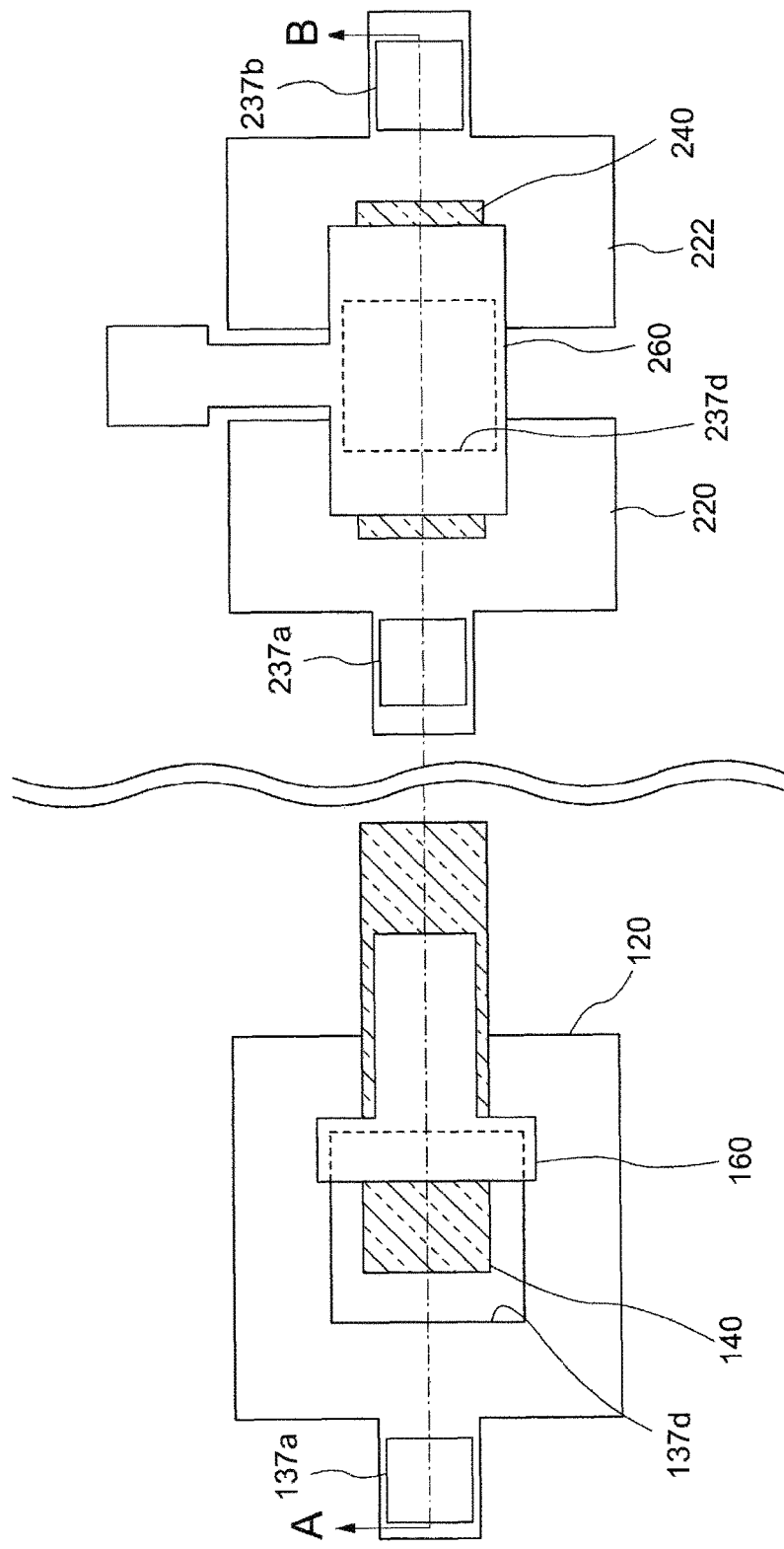
FIG. 25 is a plan view showing a step of forming gate insulating layers and gate electrodes in the manufacturing method of the semiconductor device in the embodiment according to the present invention.
Figure 26:
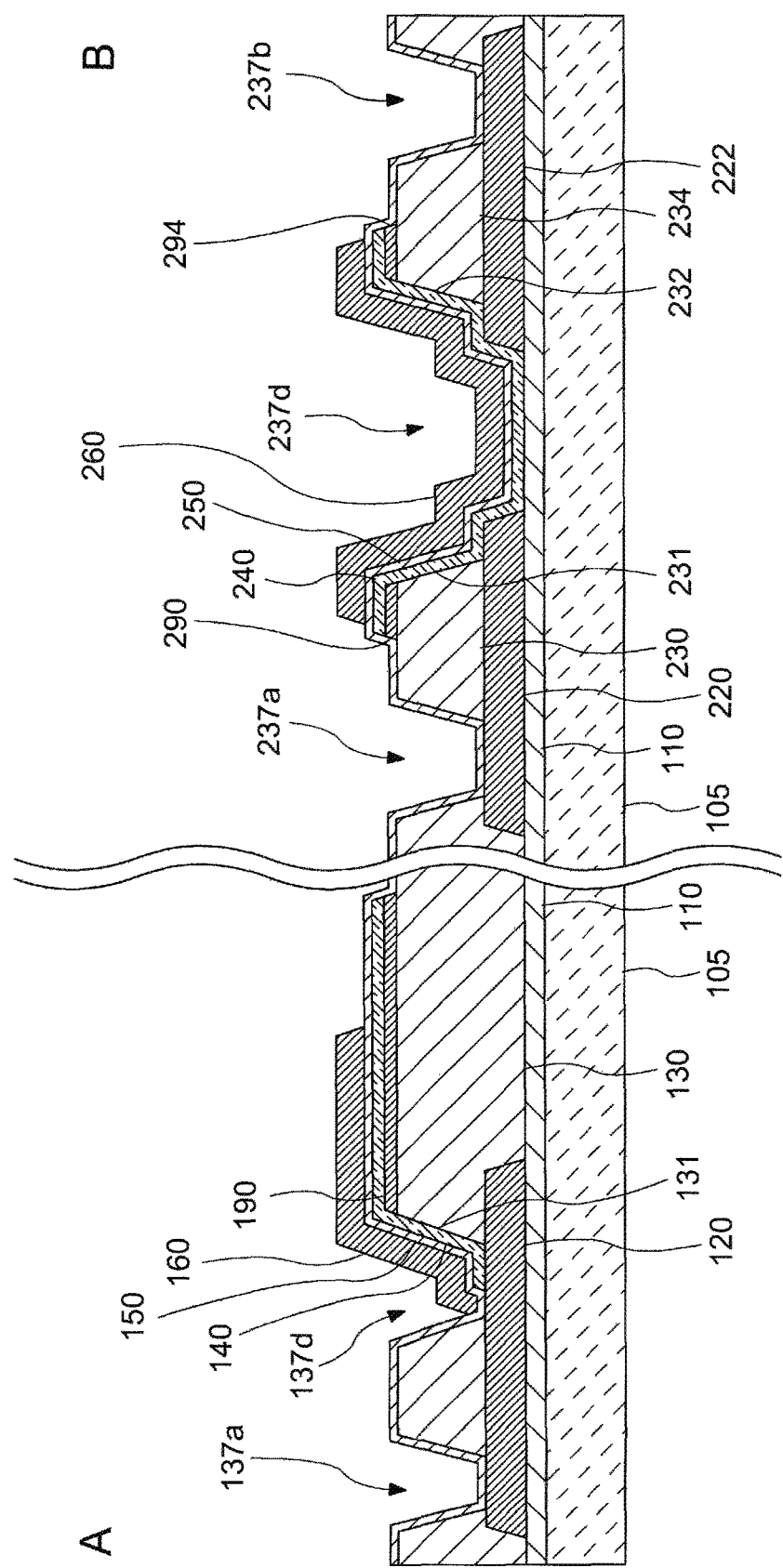
FIG. 26 is a cross-sectional view showing the step of forming the gate insulating layers and the gate electrodes in the manufacturing method of the semiconductor device in the embodiment according to the present invention.

FIG. 25 and FIG. 26 are respectively a plan view and a cross-sectional view showing a step of forming the first gate insulating layer 150, the second gate insulating layer 250, the first gate electrode 160 and the second gate electrode 260 in the manufacturing method of the semiconductor device 20 in embodiment 2 according to the present invention. Referring to FIG. 26, the first gate insulating layer 150, the second gate insulating layer 250, and a film for the first gate electrode 160 and the second gate electrode 260 are formed on the entire surface of the substrate shown in FIG. 24, and patterning is performed by photolithography and etching to form the first gate electrode 160 and the second gate electrode 260 as shown in FIG. 25.

In the example shown in FIG. 26, the first gate insulating layer 150 and the second gate insulating layer 250 respectively act as etching stoppers for the first gate electrode 160 and the second gate electrode 260, so that only the first gate electrode 160 and the second gate electrode 260 are formed by etching. Alternatively, the first gate insulating layer 150, the second gate insulating layer 250, the first gate electrode 160 and the second gate electrode 260 may be formed in one, same etching step.

Figure 27:
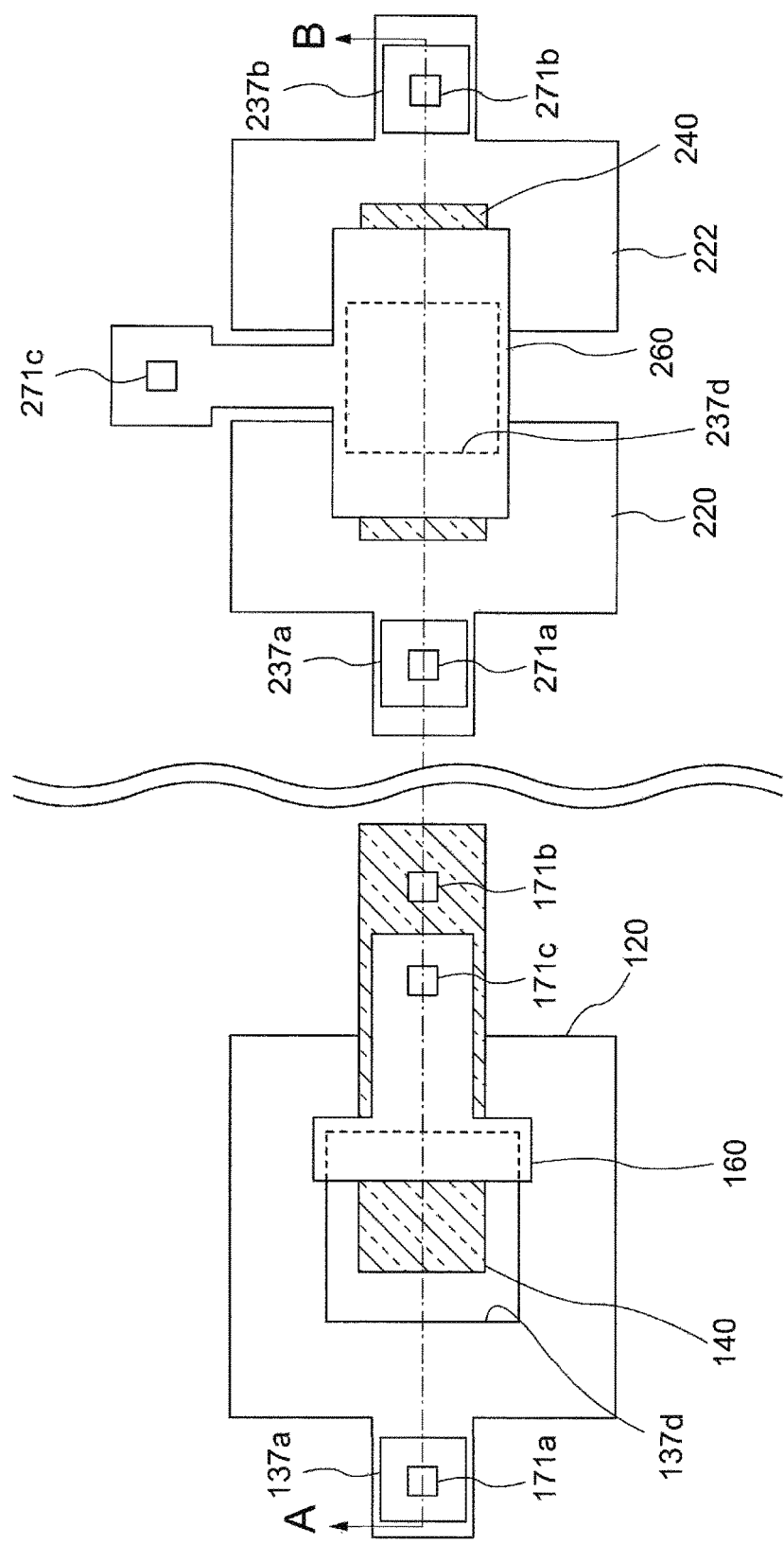
FIG. 27 is a plan view showing a step of forming interlayer films and forming openings in the interlayer films and the gate insulating layers in the manufacturing method of the semiconductor device in the embodiment according to the present invention.
Figure 28:
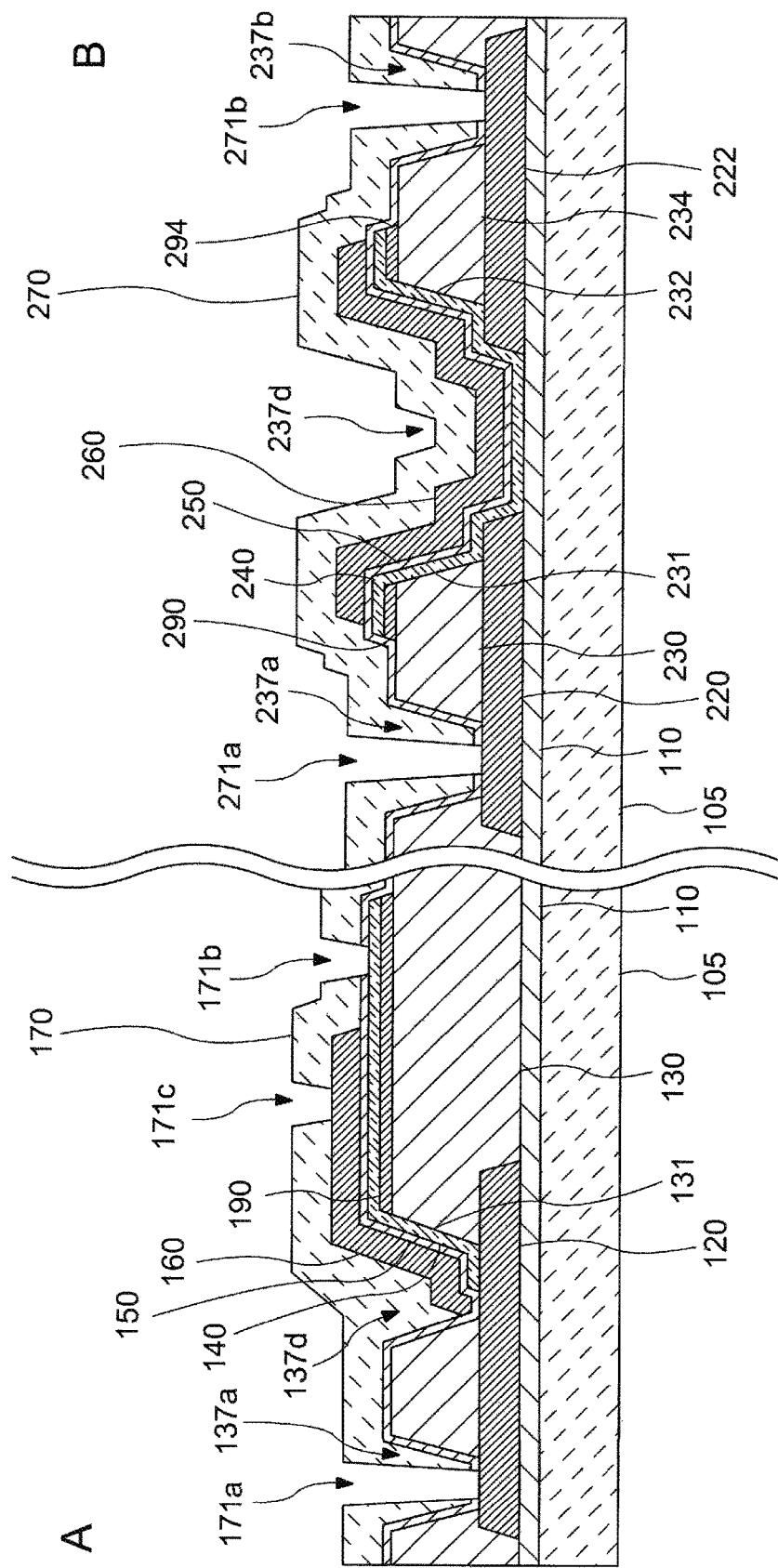
FIG. 28 is a cross-sectional view showing the step of forming the interlayer films and forming the openings in the interlayer films and the gate insulating layers in the manufacturing method of the semiconductor device in the embodiment according to the present invention.

FIG. 27 and FIG. 28 are respectively a plan view and a cross-sectional view showing a step of forming the first interlayer film 170 and the second interlayer film 270, forming the first openings 171 in the first interlayer film 170 and the first gate insulating layer 150, and forming the second openings 271 in the second interlayer film 270 and the second gate insulating layer 250 in the manufacturing method of the semiconductor device 20 in embodiment 2 according to the present invention. Referring to FIG. 28, the first interlayer film 170 and the second interlayer film 270 are formed on the entire surface of the substrate shown in FIG. 26, and patterning is performed by photolithography and etching to form the first openings 171 and the second openings 271 as shown in FIG. 27. The first opening 171a exposes the first lower electrode 120, the first opening 171b exposes the first oxide semiconductor layer 140, and the first opening 171c exposes the first gate electrode 160. The second opening 271a exposes the second lower electrode 220, the second opening 271b exposes the third lower electrode 222, and the second opening 271c (see FIG. 27) exposes the second gate electrode 260.

Preferably, the etching rate ratio of the etching rate to form the first openings 171 and the second openings 271 in the first gate insulating layer 150, the second gate insulating layer 250, the first interlayer film 170 and the second interlayer film 270 with respect to the etching rate of the first lower electrode 120, the second lower electrode 220, the third lower electrode 222, the first oxide semiconductor layer 140, the second oxide semiconductor layer 240, the first gate electrode 160 and the second gate electrode 260 exposed by the first openings 171 and the second openings 271 is high.

Then, a film for the first upper electrodes 180 and the second upper electrodes 280 is formed on the entire surface of the substrate shown in FIG. 28, and patterning is performed to form the first upper electrodes 180 and the second upper electrodes 280 as shown in FIG. 17 and FIG. 18. The semiconductor device 20 in embodiment 2 according to the present invention is manufactured by the manufacturing method described above. Referring to FIG. 18, a portion of the first oxide semiconductor layer 140 that is located on the first side wall 131 is a channel region 141 of the first transistor 100. The second oxide semiconductor layer 240 located between the second lower electrode 220 and the third lower electrode 222 is a channel region 241 of the second transistor 200.

As described above, with the manufacturing method of the semiconductor 20 in embodiment 2 according to the present invention, the first transistor 100 including a nanometer-order channel length and the second transistor 200 including a micrometer-order channel length are formed in one, same step.

Modification 1 of Embodiment 2

Figure 29:
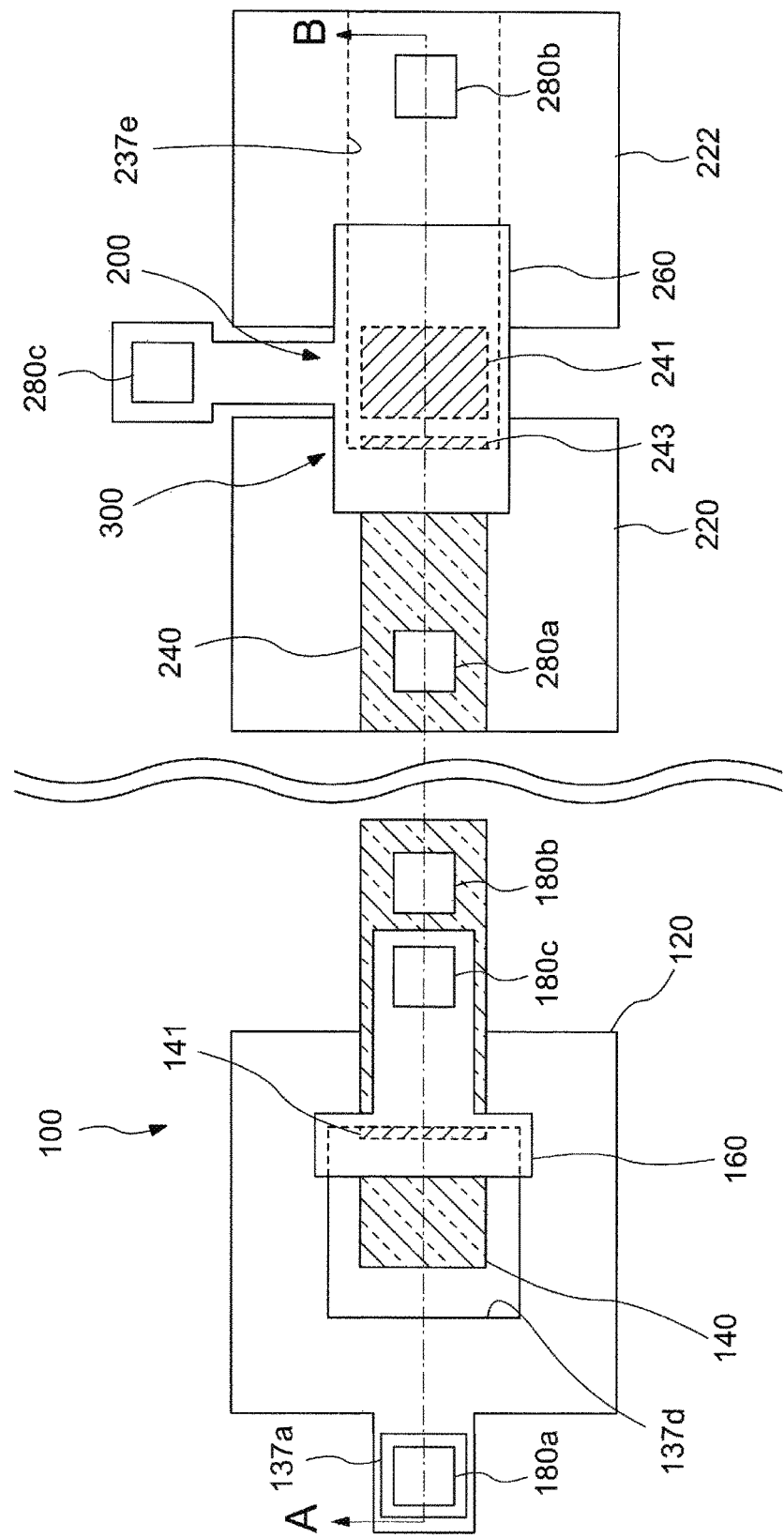
FIG. 29 is a plan view showing an overview of a semiconductor device in an embodiment according to the present invention.
Figure 30:
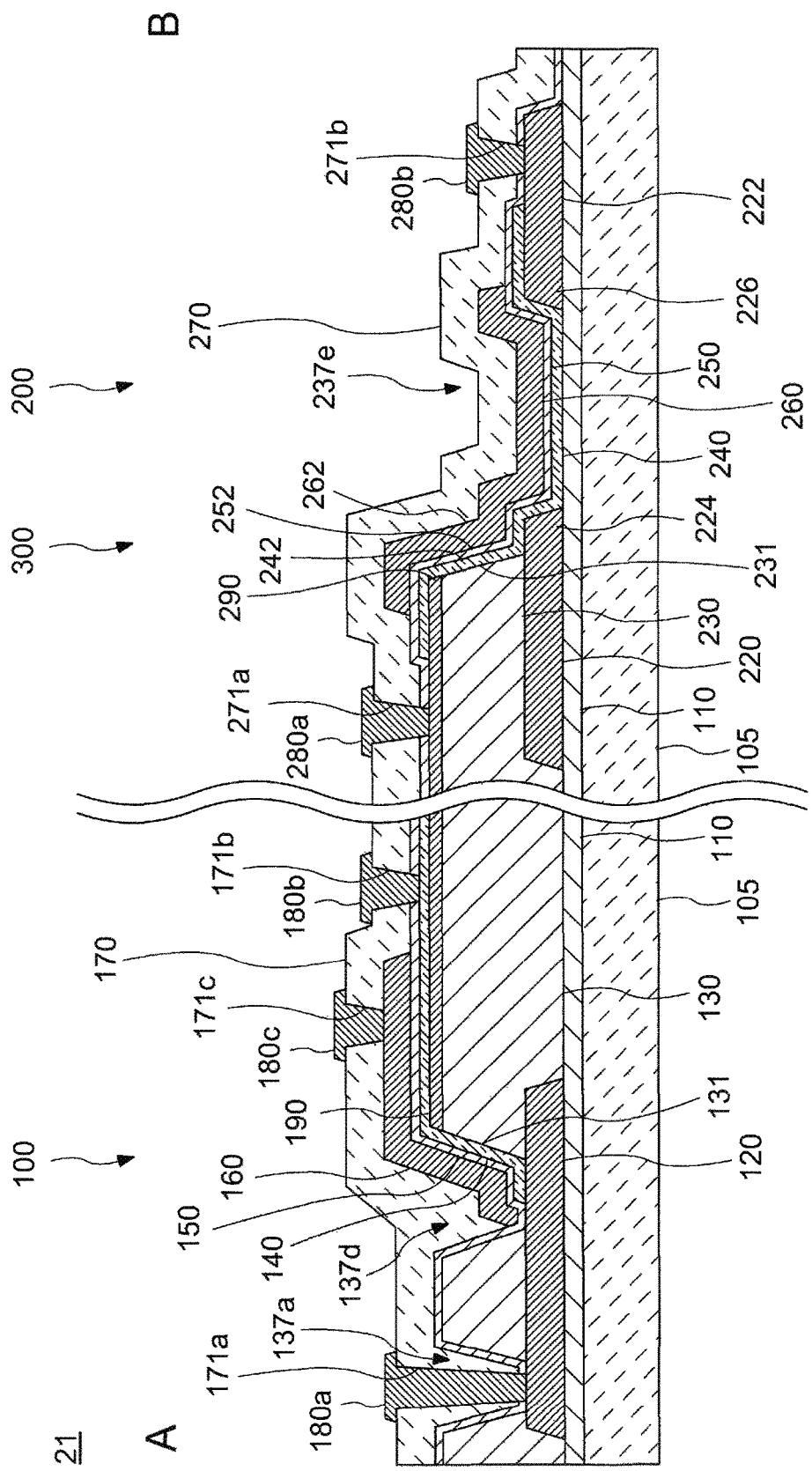
FIG. 30 is a cross-sectional view showing an overview of the semiconductor device in the embodiment according to the present invention.

With reference to FIG. 29 and FIG. 30, modification 1 of embodiment 2 according to the present invention will be described. A semiconductor device 21 in modification 1 of embodiment 2 is similar to the semiconductor device 20 in embodiment 2. In the following description, the components having the identical structures or functions to those of the semiconductor device 20 will bear the identical reference signs thereto, and detailed descriptions thereof will be omitted.

FIG. 29 and FIG. 30 are respectively a plan view and a cross-sectional view showing an overview of the semiconductor device 21 in modification 1 of embodiment 2 according to the present invention. Unlike the semiconductor device 20, the semiconductor device 21 does not include the fourth opening 237a in the second insulating layer 230. Therefore, the second upper electrode 280a is connected with the second assisting electrode 290 above the second insulating layer 230. The semiconductor device 21 includes a fourth opening 237e, which is wider than the fourth opening 237d provided in the semiconductor device 20. Unlike the semiconductor device 20, the semiconductor device 21 includes neither the third insulating layer 234 nor the third assisting electrode 294.

The semiconductor device 21 includes a third transistor 300 in addition to the first transistor 100 and the second transistor 200. The third transistor 300 includes the second insulating layer 230 located on the second lower electrode 220 and having the second side wall 231, the second assisting electrode 290 located above the second insulating layer 230, and a third oxide semiconductor layer 242 located on the second assisting electrode 290 and the second side wall 231. The third oxide semiconductor layer 242 is connected with the second oxide semiconductor layer 240 located between the second lower electrode 220 and the third lower electrode 222.

The second assisting electrode 290 may be described as being located above the second insulating layer 230 so as to be between the second insulating layer 230 and the third oxide semiconductor layer 242. The third transistor 300 also includes a third gate electrode 262 located to face the third oxide semiconductor layer 242 and a third gate insulating layer 252 located between the third oxide semiconductor layer 242 and the third gate electrode 262. In the semiconductor device 21, the second upper electrode 280a is connected with the second assisting electrode 290 through the second opening 271a. The second upper electrode 280b is connected with the third lower electrode 222 through the second opening 271b.

The third oxide semiconductor layer 242 is formed of the same layer as the first oxide semiconductor layer 140 and the second oxide semiconductor layer 240. The third gate insulating layer 252 is formed of the same layer as the first gate insulating layer 150 and the second gate insulating layer 250. The third gate electrode 262 is formed of the same layer as the first gate electrode 160 and the second gate electrode 260. It should be noted that the semiconductor device 21 is not limited to having the above-described structure, and at least a part of the third oxide semiconductor layer 242 may be formed of the same layer as the first oxide semiconductor layer 140 or the second oxide semiconductor layer 240. At least a part of the third gate insulating layer 252 may be formed of the same layer as the first gate insulating layer 150 or the second gate insulating layer 250. The third gate electrode 262 may be formed of a different material from that of the first gate electrode 160 or the second gate electrode 260.

As described above, in the semiconductor device 21, the second transistor 200 including a channel formed of the second oxide semiconductor layer 240 located on the underlying layer 110, and the third transistor 300 including a channel formed of a portion of the third oxide semiconductor layer 242 that is located on the second side wall 231, are connected in series. In FIG. 29, reference sign 241 represents the channel region of the second transistor 200, and reference sign 243 represents the channel region of the third transistor 300.

The channel length of the third transistor 300 may be adjusted by the thickness of the second insulating layer 230 and the inclination angle of the second side wall 231. The thickness of the second insulating layer 230 is controllable by a nanometer order, and therefore, the channel length of the third transistor 300 is controllable by a nanometer order. Namely, the third transistor 300 is preferable as a transistor of a short channel length. By contrast, the channel length of the second transistor 200 is controllable by a micrometer order. Therefore, the channel length of the second transistor 200 may be longer than the channel length of the third transistor 300.

In the example shown in FIG. 30, the channel length of the third transistor 300 is equal to the channel length of the first transistor 100. Alternatively, for example, the thickness of the second insulating layer 230 may be made different from the thickness of the first insulating layer 130, or the inclination angle of the second side wall 231 may be made different from the inclination angle of the first side wall 131, so that the channel length of the third transistor 300 is made different from the channel length of the first transistor 100.

Modification 2 of Embodiment 2

Figure 31:
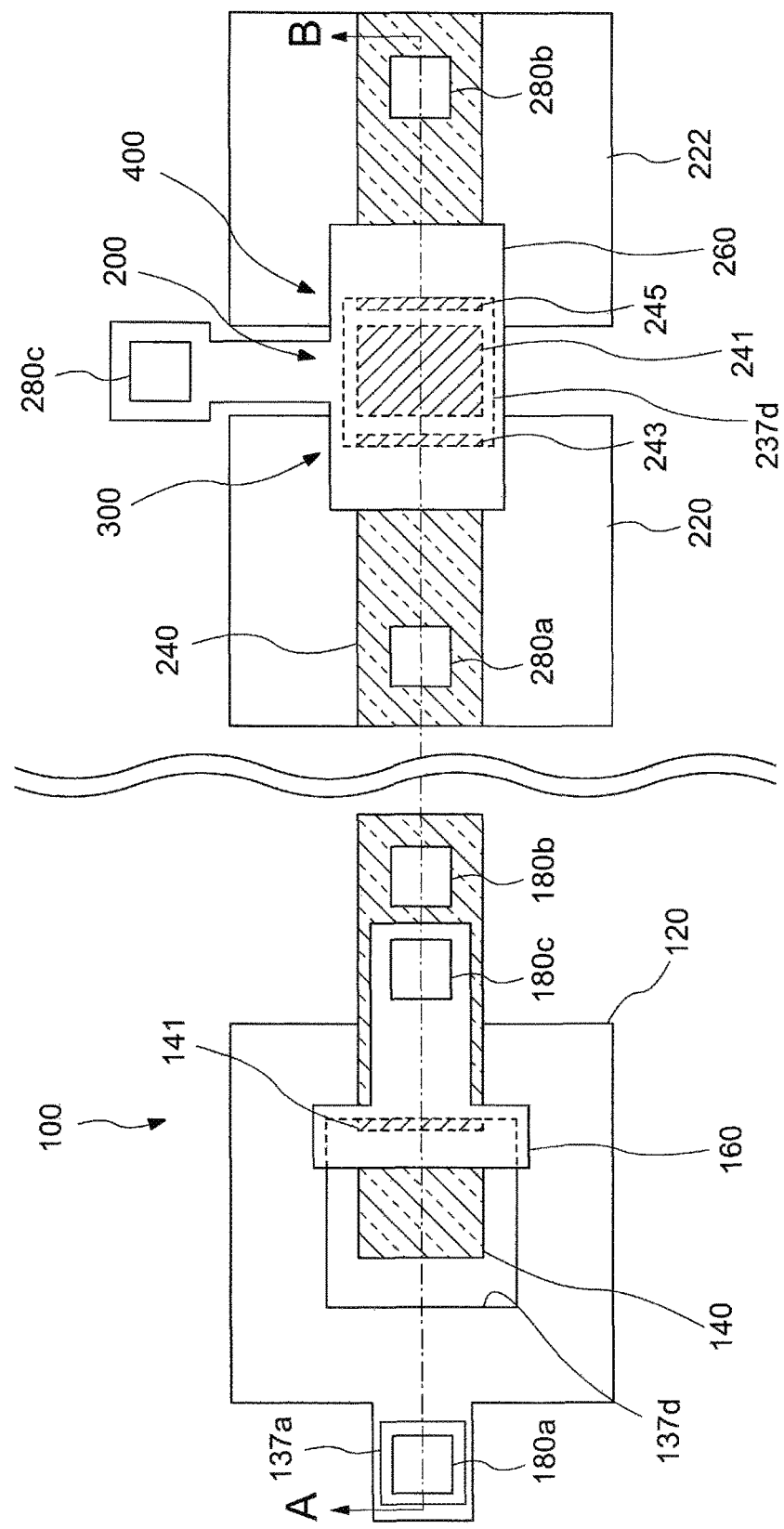
FIG. 31 is a plan view showing an overview of a semiconductor device in an embodiment according to the present invention.
Figure 32:
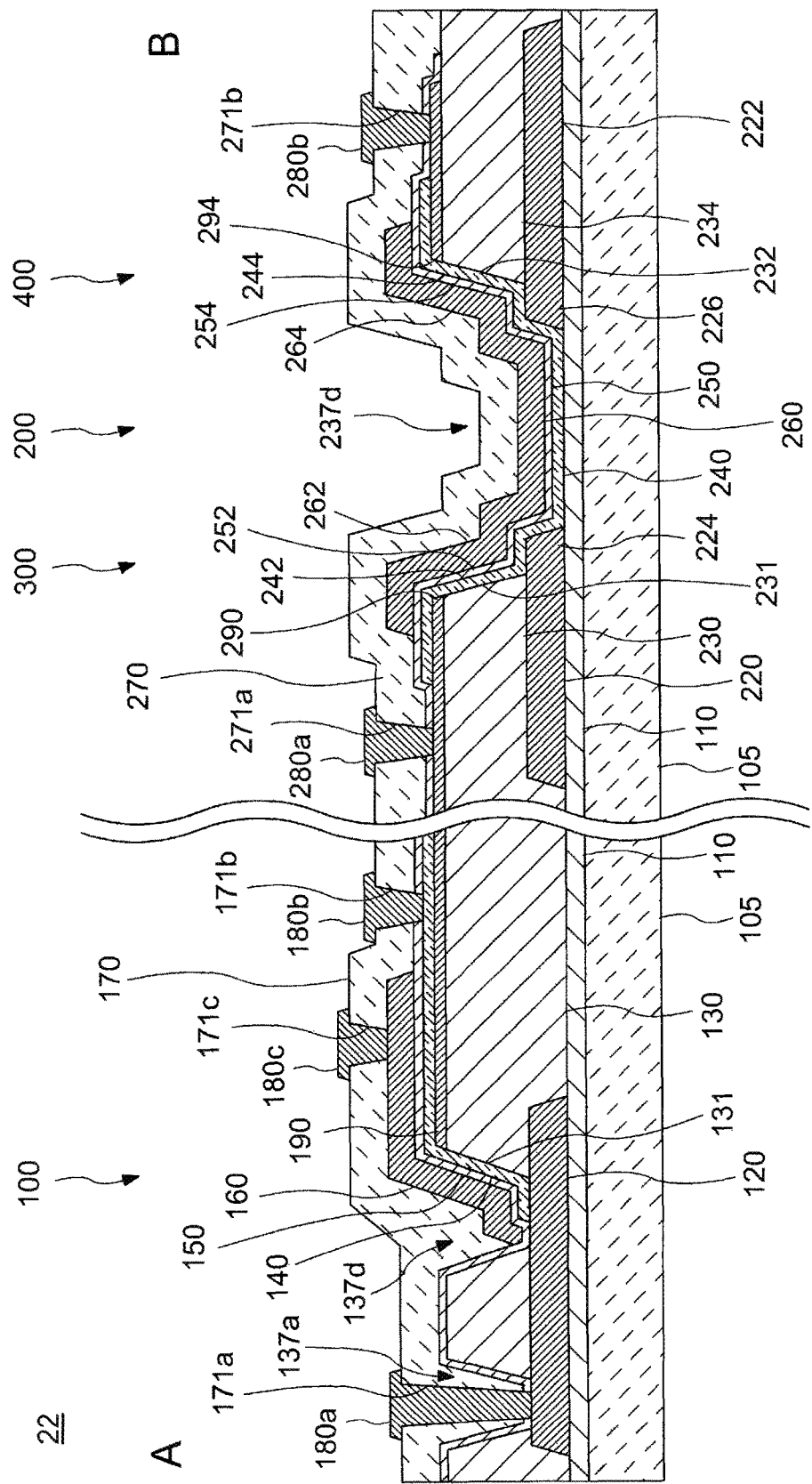
FIG. 32 is a cross-sectional view showing an overview of the semiconductor device in the embodiment according to the present invention.

With reference to FIG. 31 and FIG. 32, modification 2 of embodiment 2 according to the present invention will be described. A semiconductor device 22 in modification 2 of embodiment 2 is similar to the semiconductor device 20 in embodiment 2. In the following description, the components having the identical structures or functions to those of the semiconductor device 20 will bear the identical reference signs thereto, and detailed descriptions thereof will be omitted.

FIG. 31 and FIG. 32 are respectively a plan view and a cross-sectional view showing an overview of the semiconductor device 22 in modification 2 of embodiment 2 according to the present invention. Unlike the semiconductor device 20, the semiconductor device 22 includes neither the fourth opening 237a in the second insulating layer 230 nor the fourth opening 237b in the third insulating layer 234. Therefore, the second upper electrode 280a is connected with the second assisting electrode 290 above the second insulating layer 230, and the second upper electrode 280b is connected with the third assisting electrode 294 above the third insulating layer 234.

The semiconductor device 22 includes a third transistor 300 and a fourth transistor 400 in addition to the first transistor 100 and the second transistor 200. The third transistor 300 includes the second insulating layer 230 located on the second lower electrode 220 and having the second side wall 231, the second assisting electrode 290 located above the second insulating layer 230, and a third oxide semiconductor layer 242 located on the second assisting electrode 290 and the second side wall 231.

The fourth transistor 400 includes the third insulating layer 234 located on the third lower electrode 222 and having a third side wall 232, the third assisting electrode 294 located above the third insulating layer 234, and a fourth oxide semiconductor layer 244 located on the third assisting electrode 294 and the third side wall 232. The third oxide semiconductor layer 242 and the fourth oxide semiconductor layer 244 are connected with the second oxide semiconductor layer 240 located between the second lower electrode 220 and the third lower electrode 222.

The second assisting electrode 290 may be described as being located above the second insulating layer 230 so as to be between the second insulating layer 230 and the third oxide semiconductor layer 242. The third assisting electrode 294 may be described as being located above the third insulating layer 234 so as to be between the third insulating layer 234 and the fourth oxide semiconductor layer 244. The third transistor 300 also includes a third gate electrode 262 located to face the third oxide semiconductor layer 242 and a third gate insulating layer 252 located between the third oxide semiconductor layer 242 and the third gate electrode 262.

The fourth transistor 400 also includes a fourth gate electrode 264 located to face the fourth oxide semiconductor layer 244 and a fourth gate insulating layer 254 located between the fourth oxide semiconductor layer 244 and the fourth gate electrode 264. In the semiconductor device 22, the second upper electrode 280a is connected with the second assisting electrode 290 through the second opening 271a, and the second upper electrode 280b is connected with the third assisting electrode 294 through the second opening 271b.

The third oxide semiconductor layer 242 and the fourth oxide semiconductor layer 244 are formed of the same layer as the first oxide semiconductor layer 140 and the second oxide semiconductor layer 240. The third gate insulating layer 252 and the fourth gate insulating layer 254 are formed of the same layer as the first gate insulating layer 150 and the second gate insulating layer 250. The third gate electrode 262 and the fourth gate electrode 264 is formed of the same layer as the first gate electrode 160 and the second gate electrode 260. It should be noted that the semiconductor device 22 is not limited to having the above-described structure, and at least a part of each of the third oxide semiconductor layer 242 and the fourth oxide semiconductor layer 244 may be formed of the same layer as the first oxide semiconductor layer 140 or the second oxide semiconductor layer 240. At least a part of each of the third gate insulating layer 252 and the fourth gate insulating layer 254 may be formed of the same layer as the first gate insulating layer 150 or the second gate insulating layer 250. The third gate electrode 262 and the fourth gate electrode 264 may each be formed of a different material from that of the first gate electrode 160 or the second gate electrode 260.

As described above, in the semiconductor device 22, the second transistor 200 including a channel formed of the second oxide semiconductor layer 240 located on the underlying layer 110, the third transistor 300 including a channel formed of a portion of the third oxide semiconductor layer 242 that is located on the second side wall 231, and the fourth transistor 400 including a channel formed of a portion of the fourth oxide semiconductor layer 244 that is located on the third side wall 232, are connected in series. In FIG. 31, reference sign 241 represents the channel region of the second transistor 200, reference sign 243 represents the channel region of the third transistor 300, and reference sign 245 represents the channel region of the fourth transistor 400.

The channel length of the third transistor 300 may be adjusted by the thickness of the second insulating layer 230 and the inclination angle of the second side wall 231. The channel length of the fourth transistor 400 may be adjusted by the thickness of the third insulating layer 234 and the inclination angle of the third side wall 232. The thickness of the second insulating layer 230 and the thickness of the third insulating layer 234 are controllable by a nanometer order, and therefore, the channel length of the third transistor 300 and the channel length of the fourth transistor 400 are controllable by a nanometer order. Namely, the third transistor 300 and the fourth transistor 400 are each preferable as a transistor of a short channel length. By contrast, the channel length of the second transistor 200 is controllable by a micrometer order. Therefore, the channel length of the second transistor 200 may be longer than each of the channel length of the third transistor 300 and the channel length of the fourth transistor 400.

In the example shown in FIG. 32, the channel length of the third transistor 300 and the channel length of the fourth transistor 400 are each equal to the channel length of the first transistor 100. Alternatively, for example, the thickness of the second insulating layer 230 or the third insulating layer 234 may be made different from the thickness of the first insulating layer 130, or the inclination angle of the second side wall 231 or the third side wall 232 may be made different from the inclination angle of the first side wall 131, so that the channel length of the third transistor 300 or the fourth transistor 400 is made different from the channel length of the first transistor 100.

As described above, the semiconductor devices in the modifications of embodiment 2 according to the present invention each provide substantially the same effect as that of the semiconductor device 20.

The present invention is not limited to any of the above-described embodiments, and the embodiments may be modified appropriately without departing from the gist of the present invention.

What is claimed is:

1. A semiconductor device, comprising:
   a first transistor including:
   a first electrode;
   a first insulating layer above the first electrode, the first insulating layer having a first sidewall;
   a first oxide semiconductor layer on the first sidewall, the first oxide semiconductor layer being connected with a top surface of the first electrode;
   a first gate electrode facing the first oxide semiconductor layer;
   a first gate insulating layer between the first oxide semiconductor layer and the first gate electrode;
   a second electrode above the first insulating layer, the second electrode being connected with a top surface of the first oxide semiconductor layer; and a first assisting electrode on the first insulating layer, the first assisting electrode being connected with a bottom surface of the first oxide semiconductor layer; and a second transistor including:
- a third electrode;
- a fourth electrode separated from the third electrode;
- a second oxide semiconductor layer between the third electrode and the fourth electrode, the second oxide semiconductor layer being connected with a top surface of each of the third electrode and the fourth electrode;
- a second gate electrode facing the second oxide semiconductor layer; and
- a second gate insulating layer between the second oxide semiconductor layer and the second gate electrode.

2. The semiconductor device according to claim 1, wherein the first oxide semiconductor layer and the second oxide semiconductor layer are formed of the same layer as each other.

3. The semiconductor device according to claim 2, wherein the first gate insulating layer and the second gate insulating layer are formed of the same layer as each other.

4. The semiconductor device according to claim 3, wherein the first gate electrode and the second gate electrode are formed of the same layer as each other.

5. The semiconductor device according to claim 4, wherein the first electrode, the third electrode and the fourth electrode are formed of the same layer as each other.

6. The semiconductor device according to claim 1, wherein a length of the second oxide semiconductor layer between the third electrode and the fourth electrode is longer than a length of the first oxide semiconductor layer between the first electrode and the second electrode.

7. The semiconductor device according to claim 1, wherein:
the second transistor further includes:
- a second insulating layer having a second sidewall;
- a third oxide semiconductor layer on the second sidewall, the third oxide semiconductor layer being connected with the second oxide semiconductor layer,
- a third gate electrode facing the third oxide semiconductor layer, and
- a third gate insulating layer between the third oxide semiconductor layer and the third gate electrode; and
the third electrode is located above the second insulating layer.

8. The semiconductor device according to claim 7, wherein the first oxide semiconductor layer, the second oxide semiconductor layer and the third oxide semiconductor layer are formed of the same layer as each other.

9. The semiconductor device according to claim 8, wherein the first gate insulating layer, the second gate insulating layer and the third gate insulating layer are formed of the same layer as each other.

10. The semiconductor device according to claim 9, wherein the first gate electrode, the second gate electrode and the third gate electrode are formed of the same layer as each other.

11. The semiconductor device according to claim 10, wherein the second electrode and the third electrode are formed of the same layer as each other.

12. The semiconductor device according to claim 7, wherein:
the length of the second oxide semiconductor layer between the third electrode and the fourth electrode is longer than the length of the first oxide semiconductor layer between the first electrode and the second electrode; and
a length of the third oxide semiconductor layer between the third electrode and the second oxide semiconductor layer is equal to the length of the first oxide semiconductor layer between the first electrode and the second electrode.

13. The semiconductor device according to claim 1, further comprising a second insulating layer above the third electrode;
wherein:
the third electrode includes a protrusion portion protruding from an end of the second insulating layer; and
the second oxide semiconductor layer is connected with the protrusion portion.

14. The semiconductor device according to claim 7, wherein:
the second transistor further includes:
- a third insulating layer having a third sidewall;
- a fourth oxide semiconductor layer on the third sidewall, the fourth oxide semiconductor layer being connected with the second oxide semiconductor layer,
- a fourth gate electrode facing the fourth oxide semiconductor layer; and
- a fourth gate insulating layer between the fourth oxide semiconductor layer and the fourth gate electrode; and
the fourth electrode is located above the third insulating layer.

15. The semiconductor device according to claim 14, wherein the first oxide semiconductor layer, the second oxide semiconductor layer, the third oxide semiconductor layer and the fourth oxide semiconductor layer are formed of the same layer as each other.

16. The semiconductor device according to claim 15, wherein the first gate insulating layer, the second gate insulating layer, the third gate insulating layer and the fourth gate insulating layer are formed of the same layer as each other.

17. The semiconductor device according to claim 16, wherein the first gate electrode, the second gate electrode, the third gate electrode and the fourth gate electrode are formed of the same layer as each other.

18. The semiconductor device according to claim 17, wherein the second electrode, the third electrode and the fourth electrode are formed of the same layer as each other.

19. The semiconductor device according to claim 14, wherein:
the length of the second oxide semiconductor layer between the third electrode and the fourth electrode is longer than the length of the first oxide semiconductor layer between the first electrode and the second electrode; and
the length of the third oxide semiconductor layer between the third electrode and the second oxide semiconductor layer, and a length of the fourth oxide semiconductor layer between the fourth electrode and the second oxide semiconductor layer, are each equal to the length of the first oxide semiconductor layer between the first electrode and the second electrode.

20. The semiconductor device according to claim 1, further comprising:
a second insulating layer above the third electrode; and
a third insulating layer above the fourth electrode;
wherein:

the third electrode includes a first protrusion portion protruding from an end of the second insulating layer;
the fourth electrode includes a second protrusion portion protruding from an end of the third insulating layer;
the second oxide semiconductor layer is connected with the first protrusion portion; and
the second oxide semiconductor layer is connected with the second protrusion portion.

* * * * *